US006455222B1

(12) United States Patent

Fukino et al.

(10) Patent No.: US 6,455,222 B1

(45) Date of Patent: Sep. 24, 2002

(54) LITHOGRAPHIC PRINTING PLATE PRECURSOR

(75) Inventors: Kiyotaka Fukino, Shizuoka (JP); Keiji Akiyama, Shizuoka (JP)

(73) Assignee: Fuji Photo Film Co., Ltd., Minami-ashigara (JP)

( * ) Notice: Subject to any disclaimer, the term of this patent is extended or adjusted under 35 U.S.C. 154(b) by 0 days.

(21) Appl. No.: 09/531,592

(22) Filed: Mar. 20, 2000

(30) Foreign Application Priority Data

| | | |
|---|---|---|
| Mar. 24, 1999 | (JP) | 11-079892 |
| Aug. 10, 1999 | (JP) | 11-226632 |

(51) Int. Cl.[7] .............................. G03F 7/09; G03F 1/72

(52) U.S. Cl. ................. 430/270.1; 430/138; 430/273.1; 101/130; 101/453; 101/467

(58) Field of Search ........................... 430/270.1, 273.1, 430/138, 275.1; 101/130, 453, 467

(56) References Cited

U.S. PATENT DOCUMENTS

| | | | | |
|---|---|---|---|---|
| 5,849,464 A | | 12/1998 | Yokoya et al. | 430/303 |
| 5,985,515 A | * | 11/1999 | Van Rompuy et al. | 430/272.1 |
| 6,040,113 A | * | 3/2000 | Van Damme et al. | 430/271.1 |
| 6,096,476 A | * | 8/2000 | Yanagida et al. | 430/270.1 |
| 6,096,479 A | * | 8/2000 | Kawamura et al. | 430/270.1 |
| 6,103,087 A | * | 8/2000 | Mori | 205/214 |
| 6,146,812 A | * | 11/2000 | Leon et al. | 430/270.1 |
| 6,165,679 A | * | 12/2000 | Van Damme et al. | 430/270.1 |
| 6,186,067 B1 | * | 2/2001 | Rorke et al. | 101/467 |
| 6,190,830 B1 | * | 2/2001 | Leon et al. | 430/270.1 |
| 6,244,181 B1 | * | 6/2001 | Leenders et al. | 101/467 |

FOREIGN PATENT DOCUMENTS

| | | |
|---|---|---|
| EP | 0 794 055 A2 | 9/1997 |
| EP | 0 849 191 A1 | 6/1998 |
| EP | 0 862 998 A1 | 9/1998 |
| WO | WO 94/18005 | 8/1994 |
| WO | WO 98/40212 | 9/1998 |

* cited by examiner

*Primary Examiner*—Janet Baxter
*Assistant Examiner*—Barbara Gilmore
(74) *Attorney, Agent, or Firm*—Burns, Doane, Swecker & Mathis, LLP

(57) ABSTRACT

A heat mode type lithographic printing plate precursor which can be directly mounted on a printing press without development processing after scanning exposure for a short time to conduct plate-making, has excellent press life and also gives few print stains onto a printed face, which comprises a substrate having provided thereon an image recording layer containing fine light-heat convertible particles which are coated with a hydrophilic material, the layer being made hydrophobic by the action of heat.

5 Claims, No Drawings

LITHOGRAPHIC PRINTING PLATE PRECURSOR

FIELD OF THE INVENTION

The present invention relates to a directly thermosensitive lithographic printing plate precursor for offset printing requiring no development and having excellent press life. More particularly, the present invention relates to a lithographic printing plate precursor that can record images by scanning exposure based on digital signals and can be water developed, or can be mounted on a printing press (hereinafter, sometimes called "a printing machine") as such without development to conduct printing.

BACKGROUND OF THE INVENTION

In general, lithographic printing plates comprise lipophilic image areas receiving ink in the printing process and hydrophilic non-image areas receiving fountain solution. As lithographic printing plate precursor, presensitized plates have hitherto been widely used in which lipophilic light-sensitive resin layers are formed on hydrophilic supports. In methods for making the plates, the non-image areas are usually removed by dissolving them in developing solutions after exposure through images of lithographic films or the like, thereby obtaining the desired printing plates.

The processes for making the conventional presensitized plates requires the operation of removing the non-image areas by dissolution after exposure, and it is one problem that has been desired to be improved with respect to the prior art to make unnecessary or simplify such additional wet treatment. In particular, the disposal of waste liquid discharged by the wet treatment has recently become a matter of concern in the whole industry from the consideration to the earth circumstances, so that a request for an improvement in this respect has become stronger.

As one of the simple plate-making methods meeting this request, a method is proposed in which such image recording layers that the non-image areas of the lithographic printing precursors can be removed in the usual printing process are used and developed on a printing machine (i.e., a printing press) after exposure to obtain final printing plates. The plate-making system of the lithographic printing plates due to such a method is called an "on-press developing system". Specific examples thereof include the use of image recording layers soluble in fountain solutions or ink solvents and mechanical removal of image recording layers by contact with an impression cylinder or a blanket cylinder in the printing machine. However, a large problem of the on-press developing system is that it is necessary to employ, for example, a troublesome method of keeping the printing plate precursor in a completely light-shaded state or under constant-temperature conditions until the printing plate precursors are mounted on the printing machine, because the image recording layers of the printing plate precursors are not fixed even after exposure.

On the other hand, as another recent trend in this field, digital conversion techniques of electronically processing, accumulating and outputting image information by the use of computers have been widely applied, and various new image output systems corresponding to such digital conversion techniques have come in practice- Associated therewith, computer-to-plate techniques have been noted in which high convergent radiations such as laser beams bear digitized image information, and printing plate precursors are scan-exposed to the radiations to directly produce printing plates through no lithographic films. Resulting therefrom, it becomes an important problem to obtain printing plate precursors adapted to this object.

Accordingly, simplification, conversion to a dry system and dispensing with treatment of the plate-making operation have been desired more strongly than before, from both the above-mentioned circumstance problem and adaption to digital conversion.

Recently, solid lasers such as semiconductor lasers and YAG lasers, which are high in output, have become available at low cost. Accordingly, the prospects of the plate-making methods using these lasers as image recording means have become particularly encouraging, as the methods for producing the printing plates by scan-exposure that can be easily incorporated in the digital conversion techniques. In the conventional plate-making methods, low- to medium-illuminance imagewise exposure is given to light-sensitive printing plate precursor to carry out image recording according to imagewise physical property changes of printing plate precursor faces by the photochemical reaction. However, in the methods using high power density exposure using high output lasers, exposure regions are intensively irradiated with a large amount of light energy during momentary exposure time to efficiently convert light energy to heat energy, and heat changes such as chemical changes, phase changes and changes in shape or structure are allowed to occur by that heat to utilize those changes for image recording. That is to say, although image information is inputted by light energy of the laser beams, image recording is conducted by the reaction due to heat energy. Usually, the recording system utilizing heat generation caused by such high power density exposure is called heat mode recording, and conversion of light energy to heat energy is called light-heat conversion.

The great advantage of the plate-making methods using heat mode recording means is that the printing plate precursors are not sensitive to light of the usual illuminance level such as room illumination, and that fixing is not indispensable to images recorded by high illuminance exposure. That is to say, when heat mode light-sensitive materials are used in image recording, they are safe to room light before exposure, and the fixing of images is not indispensable also after exposure. Accordingly, when the plate-making process of using, for example, image recording layers insolubilized or solubilized by heat mode exposure, and removing the exposed image recording layers imagewise to form printing plates is carried out by the on-press developing system, such printing systems that images are not influenced by development (removal of non-image areas) for a certain period of time after image exposure, for example, even if exposed to room environmental light, become possible.

It is therefore expected that the use of the heat mode recording will make it possible to obtain lithographic printing plate precursors desirable for the on-press developing system.

As one of the preferred methods for producing the lithographic printing plates based on the heat mode recording, a method is proposed in which hydrophobic image recording layers are provided on hydrophilic substrates and subjected to imagewise heat mode exposure to change the solubility and dispersibility of the hydrophobic layers, and non-image areas are removed by wet development as needed.

As an example of the method using such printing plate precursors, JP-B-46-27919 (the term "JP-B" as used herein means an "examined Japanese patent publication") discloses a method in which printing plate precursors comprising hydrophilic supports having provided thereon recording layers improved in solubility by heat, exhibiting the so-called positive action, specifically recording layers having specific compositions including saccharides and melamine-formaldehyde resins, are subjected to heat mode recording, thereby obtaining printing plates.

However, all the recording layers disclosed are not sufficient in thermosensitivity, so that the sensitivity is very insufficient for heat mode scanning exposure. Further, the small discrimination of the hydrophobicity/hydrophilicity before and after exposure, that is to say, small changes in solubility, also practically introduces a problem. The poor discrimination substantially makes it difficult to perform the plate-making by the on-press developing system.

Furthermore, WO98/40212 discloses lithographic printing plate precorsors comprising substrates having provided thereon lipophilic image recording layers containing transition metal oxide colloids, the plate-making of which can be carried out without development. However, at least the present inventors consider that the lipophilic light-heat convertible layers have many problems to be solved for securing the discrimination between image areas and non-image areas.

On the other hand, EP94/18005 discloses lithographic printing plate precursors comprising supports having carried thereon hydrophilic crosslinked layers and light-heat convertible layers, the plate-making of which can be similarly carried out without development. However, there is the description that the operation of scraping away the crosslinked hydrophilic layers imagewise is necessary for the plate-making, which is considered to raise a problem with regard to simplicity.

Further, the conventional heat mode positive type printing plate precursor have a phenomenon called "residual films in non-image areas" as another large problem. That is to say, changes in solubility caused by exposure in the vicinities of the supports in the recording layers are small as compared with those in the vicinities of surfaces of the recording layers, so that the defect that film materials in the vicinities of the supports are not removed away to remain is liable to occur. It has been therefore necessary to improve this defect. In general, in the heat mode positive type printing plate precursors, heat generation in the heat mode exposure is based on light absorption of light absorbers contained in the recording layers. Accordingly, the amount of heat generated is large in the vicinities of the surfaces of the recording layers, and small in the vicinities of the supports, in many cases, which causes the degree of hydrophilization of the recording layers in the vicinities of the supports to be relatively lowered. As a result, in exposed areas in which hydrophilic surfaces should essentially be provided, hydrophobic films are often not completely removed to give residual films. Such residual films of non-image areas result in print stains on printed matter.

The plate-making and printing methods utilizing the heat mode image recording have the weak points of the above-mentioned insufficient heat mode sensitivity and the difference in sensitivity between the surfaces and bottom portions of the image recording layers, although having the advantages that printing plates can be directly produced from camera-ready copies through no films, so that the plate-making on the machine is also possible and the development operation can also be omitted. These weak points are basically defects resulting in the insufficient discrimination between the image areas and the non-image areas, and also defects directly connected to the print quality and the press life. Accordingly, in the plate-making and printing methods utilizing the heat mode image recording, basic measures for improving both the print quality and the press life can be said to be only an improvement in discrimination in the present circumstances.

SUMMARY OF THE INVENTION

An object of the present invention is to overcome the above-mentioned defects of the heat mode plate-making system using laser exposure, and namely, to provide a heat mode type lithographic printing plate precursor which can be directly mounted on a printing press without development processing after scanning exposure for a short period of time to conduct plate-making, has excellent press life and also gives few print stains onto a printed face.

Further, from the viewpoint of specific means for improving both the press life and the inhibition of print stains, another object of the present invention is to provide a heat mode type lithographic printing plate precursor which is excellent in discrimination between an image area and a non-image area.

To the above-mentioned objects, the present inventors have made intensive search for material systems significantly changing from hydrophilic to hydrophobic by the action of heat due to light-heat conversion. As a result, the present inventors have seized that the sensitivity of changes in physical properties caused by this heat resides in the compatibility of the heat generation efficiency of light-heat convertible materials, heat sources, with the proximity of the light-heat convertible materials to material systems which vary in the physical properties, thus completing the invention based on this finding.

That is to say, the present invention is as follows:

(1) A lithographic printing plate precursor comprising a substrate having provided thereon an image recording layer containing fine light-heat convertible particles which are hydrophilic in their surfaces, the layer being made hydrophobic by the action of heat;

(2) The lithographic printing plate precursor described in the above (1), wherein the fine light-heat convertible particles are formed by a hydrophilic material;

(3) The lithographic printing plate precursor described in the above (1) or (2), wherein the surfaces of the fine light-heat convertible particles are coated with a hydrophilic material;

(4) The lithographic printing plate precursor described in anyone of the above (1) to (3) which comprises the substrate having provided thereon an image recording layer containing the fine light-heat convertible particles which are hydrophilic in their surfaces, the particles being contained in the image recording layer by being dispersed in a hydrophilic medium;

(5) The lithographic printing plate precursor described in the above (4), wherein the hydrophilic medium has a sol-gel conversion property.

(6) The lithographic printing plate precursor described in any one of the above (1) to (5), wherein the substrate is a hydrophobic substrate or a substrate provided with a hydrophobic layer, the substrate having provided thereon the image recording layer comprising the hydrophilic medium, and image recording is conducted by removing the hydrophilic medium by laser beam irradiation; and (7) The lithographic printing plate precursor described in any one of the above (1) to (6), wherein a water-soluble protective layer is formed on a surface of the printing plate precursor.

The basic technique of the present invention has been obtained based on the recognition that a factor dominating the discrimination between the hydrophobicity and the hydrophilicity is the sensitivity of changes in the physical properties caused by heat, and that this sensitivity depends on, first, the high heat generation efficiency of the light-heat convertible materials, heat sources, and secondly, the adhesion of the light-heat convertible materials to the material systems which change from hydrophilic to hydrophobic by the action of heat. The main points thereof are that the light-heat convertible materials are formed in a fine particle shape, and that the surfaces thereof are made hydrophilic, thereby providing the constitution meeting both the above-mentioned first and second requirements.

The phenomena of changing from hydrophilic to hydrophobic include changes in the physical properties of a sole material, changes of two or more materials by the interaction such as chemical reaction, and conversion to different chemical substances before and after changes. In this specification, therefore, when the materials changing in the physical properties from hydrophilic to hydrophobic are indicated, the materials contributing to these changes are expressed in a lump as the "material system".

Returning to the main subject, the first condition is further described. The term "the heat generation efficiency of the light-heat convertible material" indicates the efficiency at which given light irradiation energy is converted to heat energy in an available form. "The efficiency at which given light irradiation energy is converted to heat energy in an available form" is not the mere rate of conversion from absorbed light energy to heat energy, but means the efficiency at which irradiated light energy is converted to heat energy and accumulated as heat energy of such a sufficiently high temperature as to be available. If the temperature is low, the energy is not sufficiently utilized by the physical property conversion systems of the hydrophobicity and hydrophilicity in many cases. Factors dominating this efficiency are the light absorptivity and heat energy accumulation ability of the light-heat convertible materials. That is to say, the higher light absorptivity results in more concentration of light energy on light receiving portions, so that heat energy is also intensively generated to provide high temperature, thereby also increasing the heat gradients from the light-heat convertible materials to the material systems changing in the physical properties of the hydrophobicity and hydrophilicity. Accordingly, "the heat generation efficiency of the light-heat convertible materials" which is high to given irradiated light is obtained. Then, the search for the highest density filled form of the light absorption materials have revealed that the form of fine solid particles exhibits the effect.

Then, the second requirement is described. In order to transmit the heat energy absorbed by the fine light-heat convertible particles to the material systems changing in the physical properties without waste, the form in which the material systems are directly connected to the fine particles is effective because the heat energy is prevented from being lost in the course of transmission. For meeting this requirement, the surfaces of the fine light-heat convertible particles are made hydrophilic to allow them to directly come into contact with the hydrophilic material systems changing in the physical properties by heat.

Accordingly, the basic constituent feature of the present invention described in the above (1) is to use in a hydrophilic image recording layer a light-heat convertible material which is in a fine particle form, and in which surfaces of the particles are hydrophilic. The particles themselves may be composed of an originally hydrophobic or hydrophilic material, as long as the surfaces thereof are hydrophilic.

The preferred embodiment of the present invention described in the above (2) is the case that the fine light-heat convertible particles are composed of an originally hydrophilic material such as titanium monoxide. As a matter of course, the surfaces of the particles are also hydrophilic, so that the material is used in the image recording layer of the present invention as a sole constituent material or as one of a plurality of constituent ingredients.

The preferred embodiment of the present invention described in the above (3) is the case that the degree of hydrophilicity is low even though the fine light-heat convertible particles are hydrophilic, or the case that the fine light-heat convertible particles are composed of a hydrophobic material. By sufficiently coating the surfaces thereof with a hydrophilic material, the fine particles, a source of heat generated by light-heat conversion, are incorporated into the material system changing in the physical properties of the hydrophobicity and hydrophilicity to allow the discrimination effect to be exhibited. That is to say, when many of the fine light-heat convertible particles are not so high in surface hydrophilicity, although surfaces thereof are hydrophilic, surface treatment with a strongly hydrophilic material such as a silicate causes effective transmission of the heat energy obtained by light-heat conversion to the physical property conversion system of the hydrophobicity and hydrophilicity.

The fine particles hydrophilized in their surfaces are also used in the image recording layer of the present invention as a sole constituent material or as one of a plurality of constituent ingredients.

When the image recording layer in which image recording is possible in a heat mode is constituted with such fine light-heat convertible particles hydrophilic in their surfaces, as a sole constituent ingredient having a light-heat converting function and a physical property converting function together, the fine light-heat convertible particles themselves belong to the material system changing from hydrophilic to hydrophobic by the action of heat. This is therefore said to be a more advantageous embodiment with respect to the fulfillment of the above-mentioned first and second requirements of the sensitivity of changes in the physical properties by heat.

On the other hand, in the preferred embodiment described in the above (4), the image recording layer comprises a hydrophilic medium, and the fine light-heat convertible particles hydrophilic in their surfaces are dispersed in this medium. Such a composite composition layer has the advantage that materials contributing to the light sensitivity, image characteristics, printability or film forming properties can be added as needed to collectively improve various characteristics as a printing plate. Further, this layer is also particularly convenient for allowing the removal (so-called ablation) by laser beams to take place.

Further, in this embodiment, the medium of the hydrophilic image recording layer has desirably a sol-gel conversion property, as described in the above (5).

Furthermore, in the preferred embodiment described in the above (7), a water-soluble protective layer containing a hydrophilic polymer is formed on a surface of the printing plate precursor The printing plate precursors of the present invention are liable to suffer changes in hydrophobicity and hydrophilicity, and chemical and mechanical changes such as scratches and-stains due to the influences of direct contact and environmental circumstances during various working steps in the course of plate-making, because of their hydrophilic surfaces. However, the formation of the water-soluble protective layer containing the hydrophilic polymer can protect the surface of the printing plate precursor from these influences. Specific details thereof will be further described later.

DETAILED DESCRIPTION OF THE INVENTION

Modes for carrying out the present invention are described in detail below.

Image Recording Layer (Fine Light-Heat Convertible Particles)

The light-heat convertible material used in the present invention indicates a material having an absorbance of $0.3\times10^3$ $cm^{-1}$ or more, preferably $1\times10^3$ $cm^{-1}$ or more, and more preferably a material having an absorbance of $1\times10^4$ $cm^{-1}$ or more, in which absorbed light is not substantially converted to fluorescence or phosphorescence. The absorbance is a value obtained by dividing a transmission density by a thickness.

Needless to say, many materials absorb light to some extent, and the absorption of light results in the release of heat, as long as fluorescence or phosphorescence is not emitted when the energy level of the material excited thereby returns the base level. Strictly, therefore, almost all materials can be said to have the light-heat conversion function even though they only have a little. Accordingly, it is suitable that the light-heat convertible material means a material having light absorption characteristics which can bring about desired heat changes. From the object thereof, the light-heat convertible material used in the present invention means a material having at least the above-mentioned absorbance.

On the other hand, fine light-heat convertible particles hydrophilic in their surfaces are used in the present invention, and the degree of the "hydrophilicity" of the surfaces is indicated by "the degree of surface hydrophilicity" (hereinafter also merely referred to as the degree of hydrophilicity), which is determined by the following method. That is to say, after the light-heat convertible material is deaerated under vacuum at 120° C. for 20 hours, the sample is maintained at 25° C., and the absorption isotherm of water vapor is measured. From the monomolecular adsorption of water calculated using the Langmuir equation and the absorption cross sectional area of water, the hydrophilic surface area ($SH_2O$) is determined. The degree of hydrophilicity (%) is defined by $(SH_2O/SN_2)X100$ using the surface area ($SN_2$) of the light-heat convertible material measured by the use of nitrogen. The degree of hydrophilicity of the light-heat convertible material is considered to depend on a functional group (for example, >Si-OH) formed on a surface of the light-heat convertible material.

In the present invention, the degree of surface hydrophilicity of the fine hydrophilic light-heat convertible particles is preferably 30% or more, and more preferably from 50% to 100%. For reference, as the degrees of hydrophilicity of main light-heat convertible materials, the following values are obtained. However, it is considered that they show the degrees of surface hydrophilicity other than the following values, depending on the manufacturing method and the like.

| | |
|---|---|
| Carbon black (not surface treated) | 0-10% |
| Metallic iron | 20-50% |
| Iron oxide ($Fe_3O_4$) | 30-60% |
| Titanium oxide ($TiO_2$) | 50-80 % |
| α-Alumina ($Al_2O_3$) | 60-90% |
| Silica ($SiO_2$) | 70-100% |

The light-heat convertible materials used in the present invention which meet the above-mentioned requirements may be any one of metals, metal compounds such as metal oxides, metal nitrides, metal sulfides and metal carbides, nonmetallic simple substances and compounds thereof, and pigments.

Further, from another viewpoint, the fine light-heat convertible particles used in the present invention are ones themselves composed of the hydrophobic material, ones composed of the hydrophilic material or intermediate ones, as described above, each having an advantage.

<Fine Hydrophilic Light-Heat Convertible Particles>

The fine light-heat convertible particles composed of the materials which are hydrophobic themselves are described. The preferred constituent materials of the fine particles include inorganic metal oxides and inorganic metal nitrides.

Preferred examples of the inorganic metal oxides include $TiO_x$ (x=1.0–2.0), $SiO_x$ (x=0.6–2.0) and $AlO_x$ (x=1.0–2.0). As $TiO_x$ (x=1.0–2.0), there are black TiO, blackish purple $Ti_2O_3$ and $TiO_2$ showing various colors from water-whiteness to black depending on the crystal form and the contaminant. $SiO_x$ (x=0.6–2.0) include SiO, $Si_3O_2$ and $SiO_2$ showing water-whiteness or colors such as purple, blue and red depending on the coexistent material. Further, $AlO_x$ (x=1.5) include corundum showing water-whiteness or red, blue and green depending on the coexistent material.

Preferred examples of the inorganic metal nitrides which are hydrophilic themselves include $TiN_x$ (x=1.0–2.0), SiN (x=1.0–2.0) and $AlN_x$ (x=1.0–2.0). $TiN_x$ (x=1.0–2.0) include bronze-colored TiN and brown $TiN_x$ (x=1.3). $SiN_x$ (x=1.0–2.0) include $Si_2N_3$, SiN and $Si_3N_4$. Further, $AlN_x$ (x=1.0–2.0) include AlN.

The particle size of these hydrophilic metal compounds is generally from 0.01 μm to 10 μm, and preferably from 0.02 μm to 5 μm, although the optimum size thereof varies depending on the refractive index and absorption coefficient of the material constituting the particles. Too small and too coarse particles cause inefficient light absorption by light scattering and by particle interface reflection, respectively.

Further, these hydrophilic metal compounds may form the image forming layers by themselves, or after they are directly dispersed in the hydrophilic media, or after the surfaces thereof are coated with the hydrophilic materials, followed by dispersion in the hydrophilic media, as described below.

<Fine Weakly Hydrophilic Light-Heat Convertible Particles>

Then, the fine light-heat convertible particles are described which are fine particles insufficient in hydrophilicity, although the particles are hydrophilic themselves, or fine hydrophobic particles, the surfaces of which are preferably coated with hydrophilic compounds. Preferred examples of the materials constituting these fine particles are inorganic metal oxides, inorganic metal nitrides, metallic simple substances and alloys thereof, and absorptive simple substances.

Preferred examples of the metal compounds of this kind are oxides of transition metals and sulfides of the group II-VIII metals in the periodic table. Examples of the transition metal oxides include oxides of iron, cobalt, chromium, manganese, nickel, molybdenum, tellurium, niobium, yttrium, zirconium, bismuth, ruthenium, vanadium and silver. Further, oxides of zinc, mercury and cadmium can also be used in the present invention, although these metals are not included in the transition metals according to some classifications. Of these, particularly preferred examples of the metal oxides include FeO, $Fe_2O_3$, $Fe_3O_4$, CoO, $Cr_2O_3$, $MnO_2$, $ZrO_2$, $Bi_2O_3$, CuO, $CuO_2$, AgO, PbO, $PbO_2$ and $VO_x$ (x=1–5). $VO_x$ include black VO, $V_2O_3$ and $VO_2$, and brown $V_2O_5$.

When the metal oxides are lower oxides of multivalent metals, they are sometimes light-heat convertible materials and self exothermic air oxidation reactants. This case is preferred because heat energy generated as a result of the self exothermic reaction, as well as light-absorbed energy, can also be utilized. These lower oxides of the multivalent metals include lower oxides of Fe, Co and Ni.

Specific examples thereof include ferrous oxide, iron tritetraoxide, titanium monoxide, stannous oxide and chromous oxide. Of these, ferrous oxide, iron tritetraoxide and titanium monoxide are preferred.

When the fine light-heat convertible particles are composed of the metal sulfides, preferred examples of the metal sulfides are sulfides of heavy metals such as transition metals. Above all, preferred examples of the sulfides include sulfides of iron, cobalt, chromium, manganese, nickel, molybdenum, tellurium, strontium, tin, copper, silver, lead and cadmium, and particularly, silver sulfide, ferrous sulfide and cobalt sulfide are preferred.

When the fine light-heat convertible particles are composed of the metal nitrides, preferred examples of the metal nitrides are azides of metals. In particular, azides of copper, silver and tin are preferred These azide compounds are also self heat-generative compounds generating heat by photolysis.

All the above-mentioned metal oxides and sulfides can be obtained by known methods. Many of them are on the market by the names of Titan Black, iron black, molybdenum red, emerald green, cadmium red, cobalt blue, Prussian blue and ultramarine.

It can be easily confirmed by a differential thermal balance (TG/DTA) whether the self exothermic reaction takes place or not. When a self exothermic reactant is inserted into the differential thermal balance and the temperature is elevated at a constant rate, an exothermic peak appears at a certain temperature, thereby observing the occurrence of the self exothermic reaction. When the oxidation reaction of the metals or the lower-order metal oxides is used as the self exothermic reaction, the exothermic peak appears, and an increase in weight is also similarly observed in the thermal balance. Although repeated, the use of self exothermic reaction energy, in addition to the light-heat conversion mechanism, makes it possible to utilize heat energy in larger quantities per unit radiation dose than before, and continuously. Accordingly, the sensitivity can be improved.

Then, the fine light-heat convertible metal particles are described below. Many of the metal particles are light-heat convertible and also self exothermic.

Examples of the fine metal particles include fine particles of Mg, Al, Si, Ti, V, Cr, Mn, Fe, Co, Ni, Cu, Zn, Ga, Ge, Y, Zr, Nb, Mo, Tc, Ru, Pd, Ag, Cd, In, Sn, Sb, Hf, Ta, W, Re, Os, Ir, Pt, Au and Pb. These fine metal particles are light-heat convertible and also self exothermic. Of these, the metals easily bringing about the exothermic reaction such as the oxidation reaction by heat energy obtained by light-heat conversion of absorbed light are preferred. Specifically, Al, Si, Ti, V, Cr, Mn, Fe, Co, Ni, Cu, Zn, Y, Zr, Mo, Ag, In, Sn and W are preferred. Of these, Fe, Co, Ni, Cr, Ti and Zr are particularly preferred as ones having high radiation absorbance and high self exothermic reaction heat energy.

The fine metal particles may be constituted not only by simple substances of these metals, but also by two or more ingredients. Further, they may be constituted by the metals and the above-mentioned metal oxides, nitrides, sulfides and carbides. The simple substances of the metals are higher in heat energy of the self exothermic reaction such as oxidation, but the handling thereof in the air is complicated. For some of them, there is the danger of spontaneous ignition in contact with air. Such metal powders are preferably covered with metal oxides, nitrides, sulfides or carbides in a thickness of a several nanometers from the surfaces thereof.

The particle size of these particles is 10 $\mu$m or less, preferably from 0.005 $\mu$m to 5 $\mu$m, and more preferably from 0.01 $\mu$m to 3 $\mu$m. The particle size of less than 0.005 $\mu$m causes the difficulty of dispersing the particles, whereas the particle size of more than 10 $\mu$m results in the poor resolution of printed matter.

Of the above-described metal fine powders, iron (fine) powders are preferably used. Any iron powders are preferably used. Above all, iron alloy (fine) powders containing $\alpha$-Fe as a main component are preferred. These powders may contain, in addition to the prescribed atoms, the following atoms, e.g., Al, Si, S, Sc, Ca, Ti, V, Cr, Cu, Y, Mo, Rh, Pd, Ag, Sn, Sb, Te, Ba, Ta, W, Re, Au, Hg, Pb, Bi, La, Ce, Pr, Nd, P, Co, Mn, Zn, Ni, Sr and B. In particular, it is preferred to contain at least one of Al, Si, Ca, Y, Ba, La, Nd, Co, Ni and B, in addition to a-Fe, and more preferably at least one of Co, Y and Al in addition to $\alpha$-Fe. The content of Co is preferably from 0 to 40 atomic %, more preferably from 15 to 35 atomic %, and most preferably from 20 to 35 atomic %, the content of Y is preferably from 1.5 to 12 atomic %, more preferably from 3 to 10 atomic %, and most preferably from 4 to 9 atomic %, the content of Al is preferably from 1.5 to 12 atomic %, more preferably from 3 to 10 atomic %, and most preferably from 4 to 9 atomic %, each based on Fe. Iron alloy fine powders may contain a small amount of a hydroxide or an oxide. Specific examples thereof are disclosed in JP-B-44-14090 (the term "JP-B" as used herein means an "examined Japanese patent publication"), JP-B-45-18372, JP-B-47-22062, JP-B-47-22513, JP-B-46-28466, JP-B-46-38755, JP-B-47-4286, JP-B-47-12422, JP-B-47-17284, JP-B-47-18509, JP-B-47-18573, JP-B-39-10307, JP-B-46-39639, U.S. Pat. Nos. 3,026,215, 3,031,341, 3,100,194, 3,242,005, and 3,389,014.

Iron alloy fine powders can be prepared by well-known processes, such as a method comprising reducing a composite organic acid salt (e.g., organic acid salt comprising mainly an oxalate) with a reducing gas (e.g., hydrogen); a method comprising reducing iron oxide with a reducing gas (e.g., hydrogen), to obtain Fe or Fe-Co particles; a method comprising pyrolysis of a metal carbonyl compound; a method comprising adding to an aqueous solution of a ferromagnetic metal a reducing agent (e.g., sodium boronhydride, hypophosphite, or hydrazine), to conduct reduction; and a method comprising evaporating a metal in a low pressure inert gas to obtain a fine powder. The thus-obtained ferromagnetic alloy powders which are subjected to well-known gradual oxidization treatment can be used in the present invention, e.g., a method comprising immersing powders in an organic solvent, then drying; a method comprising immersing powders in an organic solvent, then charging an oxygen-containing gas to form oxide films on the surfaces thereof and drying; and a method comprising forming oxide films on the surfaces of the powders by regulating partial pressure of an oxygen gas and an inert gas without using an organic solvent.

Iron alloy powders which can be preferably used in the present invention have a specific surface area ($S_{BET}$) as measured by the BET method of from 10 to 80 $m^2/g$, preferably from 20 to 60 $m^2/g$. When SBET is less than 10 $m^2/g$, surface property is deteriorated, and when $S_{BET}$ is more than 80 $m^2/g$, good dispersibility is obtained with difficulty, which is not preferred. Iron alloy (fine) powders according to the present invention have a crystallite size of generally from 80 to 350 Å, preferably from 100 to 250 Å, and more preferably from 140 to 200 Å. The length of a long axis of iron alloy (fine) powders is generally from 0.02 to 0.25 $\mu$m, preferably from 0.05 to 0.15 $\mu$m, and more preferably from 0.06 to 0.1 $\mu$m. Iron alloy (fine) powders preferably have an acicular ratio of from 3 to 15, more preferably from 5 to 12.

The above-mentioned fine weakly hydrophilic particles, or the fine particles of the inorganic metal oxides, the inorganic metal nitrides, the metallic simple substances and alloys thereof, and the absorptive simple substances exhibit the effect of the present invention by the hydrophilization treatment of the surfaces thereof. Surface hydrophilization means which can be used include a method of surface treating the particles with compounds which are hydrophilic and have adsorptivity on the particles, for example, surfactants, a method of surface treating the particles with compounds having hydrophilic groups reactive with constituent materials of the particles, and a method of providing the particles with protective colloidal hydrophilic polymer films. Particularly preferred is the surface silicate treatment. For example, in the case of the fine iron particles or the fine iron tritetraoxide particles, the surfaces thereof can be sufficiently hydrophilized by a method of immersing the particles in an aqueous solution of sodium silicate (3%) at 70° C. for 30 seconds. For the other fine metal particles and the other fine metal oxide particles, the surface silicate treatment can also be conducted in a similar manner.

Of these, the fine metal oxide particles hydrophilized in their surfaces, particularly the fine metal oxide particles silicate treated in their surfaces, especially the fine iron oxide or iron particles silicate treated in their surfaces, are preferred embodiments of the present invention. <Nonmetallic Simple Substances and Nonmetallic Compounds>

In the present invention, the fine light-heat convertible particles of nonmetallic simple substances and nonmetallic compounds are used, in addition to the above-mentioned metal compounds and metals. These fine light-heat convertible particles include fine particles of various kinds of organic and inorganic pigments, as well as fine particles of simple substances such as certain carbon black, graphite and bone black. Many of them are hydrophobic themselves, and therefore necessitate hydrophilic coatings on the surfaces thereof.

Any known methods can be used for surface hydrophilization. For example, the surfaces of the carbon black particles can be hydrophilized by the hydroxyl group-introducing treatment or the silicate treatment. Specifically, 10 g of the carbon black particles previously dried are placed in a reaction vessel depressurized to $10^{-2}$ Torr and deaerated. Then, water vapor is allowed to flow, and plasma irradiation is performed at an output of 20 W for one hour while rotating the reaction vessel to obtain hydroxyl group-introduced carbon black. At this stage, hydrophilization has proceeded. However, for higher hydrophilization, 1.5 g of hydroxyl group-introduced carbon black thus obtained is dispersed in 40 ml of water, and 3 ml of tetraethoxysilane is added dropwise thereto, followed by reaction at room temperature for 2 to 6 hours (the longer the reaction time is, the higher the surface hydrophilicity increases). Further, at this time, hydrochloric acid or ammonia may be added as a catalyst. After the reaction is terminated, the reaction product is washed with water, and dried to obtain carbon black whose surface is silicate-treated. In this process, it is considered that tetraethoxysilane is combined with the hydroxyl groups of hydroxyl group-introduced carbon black by dealcoholization, followed by hydrolysis of residual ethoxy groups to obtain the silicate surface.

As one reference example, with respect to the hydrophilicity of surfaces of the carbon black particles hydrophilized by the above-mentioned method, original carbon black was 4%, hydroxyl group-introduced carbon black was 35%, and surface-silicate carbon black (reaction time: 6 hours, non-catalytic) was 90%.

<Pigments>

In the present invention, any fine particle dispersible pigments can be used which have hydrophilic surfaces themselves or coating layers whose surfaces are hydrophilic, and have light absorptivity to irradiated light for image formation. Regardless of whether the pigments are metals or nonmetals, they form fine particles high in absorbance.

Preferred examples of the pigments include cobalt green (C. I. 77335), emerald green (C. I. 77410), Phthalocyanine Blue (C. I. 74100), copper phthalocyanine (C. I. 74160), ultramarine (C. I. 77007), Prussianblue (C. I. 77510), cobalt violet (C. I. 77360), Pariodiene Red 310 (C. I. 71155), Permanent Red BL (C. I. 71137), perylene red (C. I. 71140), Rhodamine Lake B (C. I. 45170:2), Helio Bordeaux BL (C. I. 14830), Light Fast Red Tonner R (C. I. 12455), Fast Scarlet VD, Resol Fast Scarlet G (C. I. 12315), Permanent Brown FG (C. I. 12480), Indanthrene Brilliant Orange RK (C. I. 59300), orange chrome (C. I. 77601), Hansa Yellow 10G (C. I. 11710), Titan Yellow (C. I. 77738), zinc yellow (C. I. 77955) and Chrome Yellow (C. I. 77600), as well as the above-mentioned various carbon simple substances. Besides, various pigments used in toners for electrostatic recording can also be preferably used.

The content of the fine light-heat convertible particles contained in the image forming layer is 2% by weight or more based on solid constituent ingredients, and when the fine light-heat convertible particles are a sole ingredient constituting the layer, the content thereof is substantially 100% by weight. When the image forming layer comprises a hydrophilic medium in which the fine light-heat convertible particles are dispersed, the content of the fine particles is from 2% to 95% by weight, and preferably from 5% to 90% by weight. Less than 2% by weight results in deficiency of calorific value, whereas exceeding 95% by weight causes a reduction in film strength.

In order to achieve the effect of the present invention, it is necessary for the image recording layer containing this light-heat convertible material to have light absorptivity on a level necessary for effective occurrence of the light-heat conversion, that is to say, particle density, in addition to that the light-heat convertible material has the above-mentioned absorbance. That necessary light absorptivity means that there is a spectral absorption region having an absorbance of 0.3 or more in a light-heat convertible region having a spectral wavelength of 300 nm to 1200 nm, and specifically that there is an absorption maximum having an absorbance of 0.3 or more in a wavelength region of irradiated light for image formation (in the case of monochromic light, a wavelength region 100 nm wide centered at that wavelength), or that there is a continuous region having an absorbance of 0.3 or more and a spectral wavelength of 100 nm or more, even if there is no absorption maximum in this wavelength region. Satisfaction of the conditions of this light absorptivity increases light sensitivity by imagewise exposure at a wavelength corresponding to this absorption wavelength region to improve discrimination.

Further, when measured in accordance with International Standards ISO5-3 and ISO5-4, the transmitting density of the image forming layer is preferably from 0.3 to 3. If the transmitting density exceeds 3.0, the radiation intensity at a bottom of the image layer is significantly lowered by attenuation of the radiation, which causes changes to hydrophobicity to be liable to occur. On the other hand, if the transmitting density is less than 0.3, radiation energy is not sufficiently absorbed, so that the amount of heat energy obtained by light-heat conversion is liable to become insufficient.

(Material Systems Changed in Physical Properties by Heat)

The description of fine light-heat convertible particles is ended, and then, the material systems changing in the physical properties from hydrophilicity to hydrophobicity are described. In the present invention, material systems changing in the physical properties by heat obtained by known various methods can be used. Examples thereof are shown below, but the present invention is not limited by these examples.

(1) Systems in Which Melting Action Occurs by Heat Obtained by Light-Heat Conversion for Hydrophobilization For example, hydrophobic low melting particles are melted by heat generated by light irradiation in the vicinity of the fine light-heat convertible particles to hydrophobilize that region. It is preferred that such low melting particles are melted at 50° C. to 200° C. Examples thereof include esters of long chain fatty acids and long chain monohydric alcohols, that is to say, waxes. As the waxes, there are carnauba wax, castor wax, microcrystalline wax, paraffin wax, shellac wax, palm wax and bees wax, according to their raw material, and any of them can be used. In addition to the waxes, fine particle dispersions of low molecular weight polyethylene; solid acids such as oleic acid, stearic acid and palmitic acid; and metal salts of long chain fatty acids such as silver behenate, calcium stearate and magnesium palmitate can also be used.

(2) Systems in Which Hydrophobilization Reaction Is Initiated by Heat Obtained by Light-Heat Conversion These systems correspond to the case that the image recording layers contain systems unreactive at ordinary temperatures, but initiated to react at higher temperatures to be hydrophobilized. In this case, it is particularly preferred that the light-heat convertible particles are self exothermic reactive. Examples thereof include systems containing heat crosslinkable polymers or oligomers having crosslinking groups in which the crosslinking reaction proceeds at higher temperatures.

(3) Systems in Which Films Are Ruptured

The heat energy is accumulated in the light-heat convertible particles, and as a result, film rupture due to heat, namely, removal (ablation) by laser beam irradiation, takes place to cause exposure of the hydrophobic substrates (or lower layers), thereby converting the surfaces of the printing plate precursors from hydrophilic to hydrophobic. This is included in the scope of the present invention as one mode of changes in the physical properties of the hydrophobicity and hydrophilicity. Accordingly, the image recording layers designed in such a manner are a preferred embodiment of the present invention. Examples thereof include image recording layers containing Titan Black or iron black as a sole constituent ingredient- As a result of removal (abrasion) caused by laser beam irradiation, particles are scattered to expose the substrates at laser beam-irradiated areas. Printing plates in which irradiated areas are ink-receptive and areas not irradiated receive fountain solutions can be directly manufactured by hydrophobilization of the surfaces of the substrates. Imagewise lipophilization by exposure of the hydrophobic substrates due to the removal by the imagewise irradiation of laser beams is a particularly preferred embodiment of the present invention.

(Structures of Image Recording Layers)

The fine light-heat convertible particles hydrophilic in their surfaces and the systems changing in the physical properties by heat of the present invention have been described above. Then, the structures of the image recording layers containing these systems are described below.

In the present invention, the simplest structure is a system in which the fine light-heat convertible particles hydrophilic in their surfaces change in the physical properties by heat, and constituted by them alone in some cases. In this example, images are recorded by removal due to the irradiation of laser beams, or hydrophilic films of the fine particle surfaces are heat ruptured (i.e., calcined) by the irradiation of laser beams to become hydrophobic. In this case, no binders may be used.

In the present invention, the image recording layers are constituted by only the fine light-heat convertible particles hydrophilic in their surfaces and the systems changing in the physical properties by heat, in some cases. This example is the case that fine wax dispersions are added to the image recording layers of the fine hydrophilic light-heat convertible particles to such a degree that the hydrophilicity of surfaces of the added layers is not impaired.

In the present invention, particularly preferred constitution of the image recording layers is systems in which the fine light-heat convertible particles hydrophilic in their surfaces and the systems changing in the physical properties by heat are dispersed in the hydrophilic binder layers. In this case, the fine light-heat convertible particles hydrophilic in their surfaces and the systems changing in the physical properties by heat may be the same or different systems.

In the present invention, it is particularly desirable that the hydrophilic binder layers are sol-gel conversion systems. Above all, sol-gel-conversion systems having the property of forming gel structures of siloxanes are preferred. In the case that the image recording layers of the present invention containing the binder layers contain binders, constitution other than the above-mentioned fine light-heat convertible particles hydrophilic in their surfaces and systems changing in the physical properties by heat is described below.

<Sol-Gel Conversion System Binder Layers>

Particularly preferred binders contained in the image recording layers of the present invention are sol-gel conversion systems described below. Sol-gel convertible systems preferably applicable to the present invention are polymers in which binding groups extending from multivalent elements form network structures through oxygen atoms and the multivalent metals have unbonded hydroxyl groups or alkoxyl groups at the same time to form resinous structures containing mixtures thereof. The polymers are in the sol state at a stage that there are many alkoxyl groups or hydroxyl groups, but the network resinous structures become strong with the progress of ether bonding. Further, they also have together the action that the hydroxyl groups are partly bonded to fine solid particles, thereby modifying the surfaces of the fine solid particles to change the hydrophilicity. The multivalent binding elements of compounds having the hydroxyl groups or alkoxyl groups performing the sol-gel conversion are aluminum, silicon, titanium and zirconium, which can be used in the present invention. Sol-gel conversion systems due to siloxane bonds which can be most preferably used are described below. Sol-gel conversion using aluminum, titanium and zirconium can be conducted by replacing each element for silicon described below.

That is to say, particularly preferably used are systems containing silane compounds each having at least one sol-gel convertible silanol group.

The systems utilizing sol-gel conversion are further described below.

Inorganic hydrophilic matrixes formed by sol-gel conversion are preferably resins having siloxane bonds and silanol groups. The image recording layers of the lithographic printing plate precursors of the present invention are sol systems containing silane compounds each having at least one silanol group, and hydrolysis condensation of the silanol groups progresses during the elapse of time after coating to form structures of siloxane skeletons (i.e., siloxane basic structure), thus forming the image recording layers by the progress of gelation. The layers formed by the gel-sol conversion are high in the degree of hydrophilicity, and therefore, the discrimination thereof from hydrophobilized areas is increased. This is therefore a feature mentioned as an advantage of the present invention. For improving physical properties such as film strength and flexibility of media of the gel structures, improving coating properties, and improving hydrophilicity, it is also possible to add organic polymers and crosslinking agents described later.

A siloxane resin forming the gel structure is represented by the following formula (I), and a silane compound having at least one silanol group is represented by the following formula (II). Further, a material system changing from hydrophilic to hydrophobic which is contained in the image recording layer is not necessarily composed of the silane compound of formula (II) alone. In general, it may be composed of either an oligomer obtained by partial hydration polymerization of the silane compound, or a mixture of the silane compound and its oligomer.

(I)

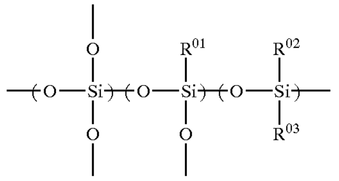

The siloxane resin of the above-mentioned formula (I) is formed by sol-gel conversion from a dispersion containing at least one silane compound represented by the following formula (II). At least one of $R^{01}$ to $R^{03}$ in formula (I) represents a hydroxyl group, and the others each represents an organic residue selected from symbols $R^0$ and Y in the following formula (II).

$$(R^0)_n Si(Y)_{4-n} \quad (II)$$

wherein $R^0$ represents a hydroxyl group, a hydrocarbon group or heterocyclic group; Y represents a hydrogen atom, a halogen atom (which represents a fluorine, chlorine, bromine or iodine atom), $—OR^1$, $—OCOR^2$ or $—N(R^3)(R^4)$ (wherein $R^1$ and $R^2$ each represents a hydrocarbon group, and $R^3$ and $R^4$, which may be the same or different, each represents a hydrogen atom or a hydrocarbon group); and n represents 0, 1, 2 or 3.

Examples of the hydrocarbon groups or the heterocyclic groups represented by formula (II) include a substituted or unsubstituted straight chain or branched alkyl group having from 1 to 12 carbon atoms [e.g., methyl, ethyl, propyl, butyl, pentyl, hexyl, heptyl, octyl, nonyl, decyl, dodecyl, each of which may be substituted with one or more substituents such as a halogen atom (chlorine, fluorine, bromine), a hydroxyl group, a thiol group, a carboxyl group, a sulfo group, a cyano group, an epoxy group, an-OR' group (wherein R' represents methyl, ethyl, propyl, butyl, heptyl, hexyl, octyl, decyl, propenyl, butenyl, hexenyl, octenyl, 2-hydroxyethyl, 3-chloropropyl, 2-cyanoethyl, N,N-dimethylaminoethyl, 2-bromoethyl, 2-(2-methoxyethyl)oxyethyl, 2-methoxycarbonylethyl, 3-carboxypropyl, benzyl), an —COR" group (wherein R" has the same meaning as R'), a —COOR" group, a —COR" group, an —N(R"')(R"') (wherein R"' represents a hydrogen atom or the same group as R', which may be the same or different), an —NHCONHR" group, an —NHCOOR" group, an $—Si(R")_3$ group, a —CONHR"' group, or an —NHCOR" group]; a substituted or unsubstituted straight chain or branched alkenyl group having from 2 to 12 carbon atoms (e.g., vinyl, propenyl, butenyl, pentenyl, hexenyl, octenyl, decenyl, dodecenyl, each of which may be substituted with the same substituent as described above for the alkyl group); a substituted or unsubstituted aralkyl group having from 7 to 14 carbon atoms (e.g., benzyl, phenethyl, 3-phenylpropyl, naphthylmethyl, 2-naphthylethyl, each of which may be substituted with one or more substituents which is (are) the same substituent(s) as described above for the alkyl group); a substituted or unsubstituted alicyclic group having from 5 to 10 carbon atoms (e.g., cyclopentyl, cyclohexyl, 2-cyclohexylethyl, 2-cyclopentylethyl, norbornyl, adamantyl, each of which may be substituted with one or more substituents which is (are) the same substituent(s) as described above for the alkyl group); a substituted or unsubstituted aryl group having from 6 to 12 carbon atoms (e.g., phenyl, naphthyl, each of which may be substituted with one or more substituents which is(are) the same substituent(s) as described above for the alkyl group); and a heterocyclic group, which may be ring-condensed, containing at least one atom selected from a nitrogen atom, an oxygen atom, and a sulfur atom (examples of the hetero atoms include a pyran ring, a furan ring, a thiophene ring, a morpholine ring, a pyrrole ring, a thiazole ring, an oxazole ring, a pyridine ring, a piperidine ring, apyrrolidone ring, a benzothiazole ring, a benzoxazole ring, a quinoline ring, and a tetrahydrofuran ring, each of which may be substituted with one or more substituents which is (are) the same substituent(s) as described above for the alkyl group).

Substituents of an $—OR^1$ group, an $—OCOR^2$ group, or an $—N(R^3)(R^4)$ group indicated by Y in formula (II) are as follows.

In the $—OR^1$ group, $R^1$ represents a substituted or unsubstituted aliphatic group having from 1 to 10 carbon atoms (e.g., methyl, ethyl, propyl, butoxy, heptyl, hexyl, pentyl, octyl, nonyl, decyl, propenyl, butenyl, heptenyl, hexenyl, octenyl, decenyl, 2-hydroxyethyl, 2-hydroxypropyl, 2-methoxyethyl, 2-(methoxyethyloxo)ethyl, 2-(N,N-diethyl-amino)ethyl, 2-methoxypropyl, 2-cyanoethyl, 3-methyloxapropyl, 2-chloroethyl, cyclohexyl, cyclopentyl, cyclooctyl, chlorocyclohexyl, methoxycyclohexyl, benzyl, phenethyl, dimethoxybenzyl, methylbenzyl, bromobenzyl).

In the —$OCOR^2$ group, $R^2$ represents the same aliphatic group as in $R^1$, or a substituted or unsubstituted aromatic group having from 6 to 12 carbon atoms (e.g., the same aryl groups as described above for $R^0$).

In the —$N(R^3)$ $(R^4)$ group, $R^3$ and $R^4$, which may be the same or different, each represents a hydrogen atom, or a substituted or unsubstituted aliphatic group having from 1 to 10 carbon atoms (e.g., the same groups as described above for $R^1$ in the —$OR^1$ group).

More preferably the total carbon atoms contained in $R^1$ and $R^2$ are 16 or less.

Specific examples of the silane compounds represented by formula (II) are shown below, but it should not be construed as the present invention is limited thereto: methyltrichlorosilane, methyltribromosilane, methyltrimethoxysilane, methyltriethoxysilane, methyltriisopropoxysilane, methyltri(t-butoxy)silane, ethyltrichlorosilane, ethyltribromosilane, ethyltrimethoxysilane, ethyltriethoxy-silane, ethyltriisopropoxysilane, ethyltri(t-butoxy)silane, n-propyltrichlorosilane, n-propyltribromosilane, n-propyltrimethoxysilane, n-propyltriethoxysilane, n-propyltriisopropoxysilane, n-propyltri(t-butoxy)silane, n-hexyltrichlorosilane, n-hexyltribromosilane, n-hexyltrimethoxysilane, n-hexyltriethoxysilane, n-hexyltriisopropoxysilane, n-hexyltri(t-butoxy)silane, n-decyltrichlorosilane, n-decyltribromosilane, n-decyltrimethoxysilane, n-decyltriethoxysilane, n-decyltriisopropoxysilane, n-decyltri(t-butoxy) silane, n-octadecyltrichlorosilane, n-octadecyltribromosilane, n-octadecyltrimethoxysilane, n-octadecyltriethoxysilane, n-octadecyltriisopropoxysilane, n-octadecyltri(t-butoxy)silane, phenyltrichlorosilane, phenyltribromosilane, phenyltrimethoxysilane, phenyltriethoxysilane, phenyltri-isopropoxysilane, phenyltri (t-butoxy) silane, tetrachlorosilane, tetrabromosilane, tetramethoxysilane, tetraethoxysilane, tetraisopropoxysilane, tetrabutoxysilane, dimethoxydiethoxysilane, dimethyldichlorosilane, dimethyldibromosilane, dimethyldimethoxysilane, dimethyldiethoxysilane, diphenyldichlorosilane, diphenyldibromosilane, diphenyl-dimethoxysilane, diphenyldiethoxysilane, phenylmethyl-dichlorosilane, phenylmethyldibromosilane, phenylmethyldimethoxysilane, phenylmethyldiethoxysilane, triethoxyhydrosilane, tribromohydrosilane, trimethoxyhydrosilane, triisopropoxyhydrosilane, tri(t-butoxy)hydrosilane, vinyltrichlorosilane, vinyltribromosilane, vinyltrimethoxysilane, vinyltriethoxysilane, vinyltriisopropoxysilane, vinyltri(t-butoxy)silane, trifluoropropyltrichlorosilane, trifluoropropyltribromosilane, trifluoropropyltrimethoxysilane, trifluoropropyltriethoxysilane, trifluoropropyltriisopropoxysilane, trifluoropropyltri(t-butoxy)silane, γ-glycidoxypropylmethyldimethoxysilane, γ-glycidoxypropyl-methyldiethoxysilane, γ-glycidoxypropyltrimethoxysilane, γ-glycidoxypropyltriethoxysilane, γ-glycidoxypropyltriisopropoxysilane, γ-glycidoxypropyltri(t-butoxy)silane, γ-methacryloxypropylmethyldimethoxysilane, γ-methacryloxy-propylmethyldiethoxysilane, γ-methacryloxypropylmethoxysilane, γ-methacryloxypropyltriisopropoxysilane, γ-methacryloxypropyltri (t-butoxy) silane, γ-aminopropylmethyl-dimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri (t-butoxy)-silane, γ-mercaptopropylmethyldimethoxysilane, γ-mercapto-propylmethyldiethoxysilane, γ-mercaptopropyltrimethoxysilane, γ-mercaptopropyltriethoxysilane, γ-mercaptopropyltriisopropoxysilane, γ-mercaptopropyltri(t-butoxy)silane, β-(3,4-epoxycyclohexyl)ethyltrimethoxysilane, and β-(3,4-epoxycyclohexyl)ethyltriethoxysilane.

In combination with the silane compound represented by formula (II) for use in the formation of the image-recording layer of the present invention, metal compounds capable of film-forming by bonding to resins in a sol-gel conversion, such as Ti, Zn, Sn, Zr and Al compounds, can be used.

Examples of metal compounds usable in combination include $Ti(OR'')_4$ (wherein R" represents methyl, ethyl, propyl, butyl, pentyl, hexyl), $TiCl_4$, $Zn(OR'')_2$, $Zn(CH_3COCHCOCH_3)_2$, $Sn(OR'')_4$, $Sn(CH_3COCHCOCH_3)_4$, $Sn(OCOR'')_4$, $SnCl_4$, $Zr(OR'')_4$, $Zr(CH_3COCHCOCH_3)_4$, and $Al(OR'')_3$.

Further, it is preferred to use acidic or basic catalyst in the coating solution for the purpose of accelerating the hydrolysis and polycondensation reaction of the silane compound represented by formula (II) and the above-described metal compound used in combination therewith.

The catalyst used for the above purpose is an acidic or basic compound as it is or dissolved in water or a solvent such as alcohol (such a compound is hereinafter referred to as an acidic catalyst or a basic catalyst, respectively). The concentration of the catalyst is not particularly restricted, but when the catalyst with high concentration is used, the hydrolysis rate and the polycondensation rate are liable to be increased. However, since the basic catalyst used in a high concentration sometimes causes precipitation in the sol solution, it is preferred that the basic catalyst concentration be not higher than 1 N (the concentration in the aqueous solution).

The kind of the acidic or basic catalyst used is not particularly limited, but when the use of the catalyst in a high concentration is required, the catalyst constituted of elements which leave no residue in catalyst crystals upon sintering is preferred. Specific examples of acidic catalysts include hydrogen halides (e.g., hydrochloric acid), nitric acid, sulfuric acid, sulfurous acid, hydrogen sulfide, perchloric acid, hydrogen peroxide, carbonic acid, carboxylicacids (e.g., formic acid and acetic acid), substituted carboxylic acids (e.g., R of the structural formula R—COOH is substituted with other elements or substituents), and sulfonic acids (e.g., benzenesulfonic acid) Specific examples of basic catalysts include ammoniacal bases (e.g., aqueous ammonia) and amines (e.g., ethylamine, aniline).

As described above, the image recording layers formed by the sol-gel method are particularly preferred for the lithographic printing plate precursors of the present invention. Further details of the sol-gel method described above are described in the literatures such as Sumio Sakibana, "Science of Sol-Gel Methods", Agune Shofusha (1988) and Seki Hirashima, "Techniques for Preparing Functional Thin Films by the Newest Sol-Gel Methods", Sogo Gijutsu Center (1992).

<Other Additives to Image Recording Layers>

Compounds for various purposes such as control of the degree of hydrophilicity, improvement in physical strength of the recording layers, improvement in mutual dispersibility of layer-constituting compositions, improvement in coating properties, improvement in printability and facilitation of plate-making operations, as well as the above-mentioned fine light-heat convertible particles, sol-gel convertible hydrophilic resins and precursors thereof, can be added to the image recording layers. Examples of these additives include the following.

<Organic Polymers>

For the above-mentioned purposes, particularly control of the degree of hydrophilicity, improvement of strength of the recording layer and improvement in mutual solubility with other ingredients in the recording layers, organic polymers can be added to the image recording layers. Examples of the organic polymers added include polyvinyl chloride, polyvinyl alcohol, polyvinyl acetate, polyvinyl phenol, polyvinyl halogenated phenol, polyvinyl formal, polyvinyl acetal, polyvinyl butyral, polyamides, polyurethanes, polyureas, polyimides, polycarbonates, epoxy resins, phenol resins, novolak resins, condensed resins of resol phenols and aldehydes or ketones, polyvinylidene chloride, polystyrene, silicone resins, acrylic copolymers having alkali-soluble groups such as active methylene groups, phenolic hydroxyl groups, sulfonamido groups and carboxyl groups, and two- or at least three-dimensional copolymer resins thereof.

Particularly preferred examples of the compounds are phenol novolak resins or resol resins, which include novolak resins and resol resins obtained by condensation of phenol, cresol (m-cresol, p-cresol and m/p-mixed cresol), phenol/cresol (m-cresol, p-cresol and m/p-mixed cresol), phenol-modified xylene, tert-butyl phenol, octyl phenol, resorcinol, pyrogallol, catechol, chlorophenol (m-Cl and p-Cl), bromophenol (m-Br and p-Br), salicylic acid or phloroglucinol with formaldehyde, and further, condensed resins of the above-mentioned phenolic compounds and acetone. Other suitable examples of the polymers include copolymers having monomers shown in the following (1) to (12) as structural units and usually having a molecular weight of 10,000 to 200,000.

(1) Acrylamides, methacrylamides, acrylic acid esters, methacrylic acid esters and hydroxystyrenes having aromatic hydroxyl groups, for example, N-(4-hydroxyphenyl)acrylamide, N-(4-hydroxyphenyl) methacrylamide, o-, m- and p-hydroxystyrene, and o-, m- and p-hydroxyphenyl acrylate or methacrylate;

(2) Acrylic acid esters and methacrylic acid esters having aliphatic hydroxyl groups, for example, 2-hydroxyethyl acrylate or 2-hydroxyethyl methacrylate;

(3) (Substituted) acrylic acid esters such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N-dimethylaminoethyl acrylate;

(4) (Substituted) methacrylic acid esters such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate,- 2-chloroethyl methacrylate, 4-hydroxybutyl methacrylate, glycidyl methacrylate and N-dimethylaminoethyl methacrylate;

(5) Acrylamides or methacrylamrides such as acrylamide, methacrylamide, N-methylolacrylamide, N-methylolmethacryl-amide, N-ethylacrylamide, N-ethylmethacrylamide, N-hexylacrylamide, N-hexylmethacrylamide, N-cyclohexylacryl-amide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacryl-amide, N-nitrophenylacrylamide, N-nitrophenylmethacrylamide, N-ethyl-N-phenylacrylamide and N-ethyl-N-phenylmethacryl-amide;

(6) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(7) Vinyl esters such as vinyl acetate, vinyl chloroacetate, vinyl butyrate and vinyl benzoate;

(8) Styrene derivatives such as styrene, methylstyrene and chloromethylstyrene;

(9) Vinyl ketones such as methyl vinyl ketone, ethyl vinyl ketone, propyl vinyl ketone and phenyl vinyl ketone;

(10) Olefins such as ethylene, propylene, isobutylene, butadiene and isoprene;

(11) N-vinylpyrrolidone, N-vinylcarbazole, 4-vinylpyridine, acrylonitrile and methacrylonitrile;

(12) Unsaturated sulfonamides such as acrylamides such as N-(o-aminosulfonylphenyl)acrylamide, N-(m-aminosulfonyl-phenyl)acrylamide, N-(p-aminosulfonylphenyl)acrylamide, N-[1-(3-aminosulfonyl)naphthyl]acrylamide and N-(2-aminosulfonyl-ethyl)acrylamide; methacrylamides such as N-(o-aminosulfonyl-phenyl)methacrylamide, N-(m-aminosulfonylphenyl)methacryl-amide, N-(p-aminosulfonylphenyl)methacrylamide, N-[1-(3-aminosulfonyl)naphthyl]methacrylamide and N-(2-aminosulfonyl-ethyl)methacrylamide; acrylic acid esters such as o-aminosulfonyl-phenyl acrylate, m-aminosulfonylphenyl acrylate, p-aminosulfonylphenyl acrylate and 1-(3-aminosulfonylnaphthyl) acrylate; and methacrylic acid esters such as o-aminosulfonyl-phenyl methacrylate, m-aminosulfonylphenyl methacrylate, p-aminosulfonylphenyl methacrylate and 1-(3-aminosulfonyl-naphthyl) methacrylate.

It is preferred that they have a weight average molecular weight of 500 to 20,000 and a number average molecular weight of 200 to 60,000. When the organic polymers are added to the image recording layers, the amount thereof added is suitably from 1% to 200% by weight, preferably from 2% to 100% by weight, and most preferably from 5% to 50% by weight, based on solid of image recording layer.

<Hydrophilic Polymers>

As the polymers contained in the image recording layers of the lithographic printing plate precurssors of the present invention, hydroxyl group-containing organic polymers for imparting strength and surface hydrophilicity suitable for the image recording layers can be used, aside from the above-mentioned synthetic polymers. Examples thereof include water-soluble resins such as polyvinyl alcohol (PVA), modified PVA such as carboxy-modified PVA, starch and derivatives thereof, cellulose derivatives such as carboxymethyl cellulose and hydroxyethyl cellulose, casein, gelatin, polyvinylpyrrolidone, vinyl acetate-crotonic acid copolymers and styrene-maleic acid copolymers.

Further, water resistance imparting agents for crosslinking the above-mentioned hydroxyl group-containing organic polymers to harden them include glyoxal, initial condensates of aminoplasts such as melamine-formaldehyde resins and urea-formaldehyde resins, methylolated polyamide resins, polyamide-polyamine-epichlorohydrin adducts, polyamide-epichlorohydrin resins and modified polyamide-polyimide resins.

In addition, crosslinking catalysts such as ammonium chloride and silane coupling agents can be used therewith.

In the present invention, of the above-mentioned hydroxyl group-containing organic polymers, preferably, gelatin is mainly used.

Gelatin is one of derived proteins, and there is no particular limitation thereon, as long as it is one called gelatin produced from collagen. Preferably, it is light color, transparent, tasteless and odorless. Further, gelatin for photographic emulsions is more preferred, because the physical properties such as the viscosity of aqueous solutions thereof and the jelly strength of gels are within the specified range.

Further, in the image recording layers of the present invention, gelatin hardening agents are also used to harden the layers, thereby improving the water resistance.

As the gelatin hardening agents, compounds which have hitherto been known can be used. They are described, for example, in T. H. James, "The Theory of the Photographic Process", chapter 2, section III, Macmillan Publishing Co., Inc. (1977), and *Research Disclosure*, No. 17643, page 26 (December, 1970).

Preferred examples thereof include dialdehydes such as succinaldehyde, glutaraldehyde and adipoaldehyde, diketones such as 2,3-butanedione, 2,5-hexanedione, 3-hexene-2,5-dione and 1,2-cyclopentanedione, and active olefin compounds each having two or more double bonds in which electron attractive groups are adjacently bonded.

Compounds having at least 2 double-bond groups represented by the following formula (III) in each molecule are more preferred.

$$CH_2{=}CH{-}X{-} \qquad \text{(III)}$$

wherein X represents $—OSO_2—$, $—SO_2—$, —CONR— or $—SO_2NR—$ (with the proviso that R represents a hydrogen atom or an aliphatic group having 1 to 8 carbon atoms).

Preferably, R represents a hydrogen atom or an alkyl group having 1 to 6 carbon atoms which may be substituted (for example, methyl, ethyl, propyl, butyl, methylol, 2-chloroethyl, 2-hydroxyethyl, 2-hydroxypropyl, 2-carboxyethyl or 3-methoxypropyl) More preferably, X in formula (III) represents $—SO_2—$.

Specific examples thereof include resorcinol bis(vinylsulfonate), 4,6-bis(vinylsulfonyl)-m-xylene, bis(vinylsulfonylalkyl)ethers or amines, 1,3,5-tris(vinylsulfonyl)-hexahydro-s-triazine, 1,3,5-triacryloylhexahydro-s-triazine, diacrylamide, 1,3-bis(acryloyl)urea and N,N'-bismaleimides.

The amount of the gelatin hardening agents added is preferably from 0.5 part to 20 parts by weight, and more preferably from 0.8 part to 10 parts by weight, based on 100 parts of gelatin.

Within this range, the resulting image recording layers maintain the film strength and exhibit the water resistance. At the same time, the hydrophilicity of the image recording layers is not inhibited.

<Hydrophilic Sol Particles>

The image recording layers of the lithographic printing plate precursors of the present invention may further contain hydrophilic sol particles, in addition to the above-mentioned light-heat convertible material systems, organic polymers for control of hydrophilicity and enhancement of film properties, and hydroxyl group-containing organic polymers for improvement in hydrophilicity and improvement in film properties.

Although there is no particular limitation on the hydrophilic sol particles, silica sol, alumina sol, titaniumoxide, magnesium oxide, magnesium carbonate and calcium alginate are preferred. They can be used for enhancement of hydrophilicity and sol-gel films, even though they are not light-heat convertible.

Silica sol, alumina sol, calcium alginate sol or mixtures thereof are more preferred.

Silica sol has many hydroxyl groups on its surface, and the inside thereof constitutes the siloxane bond (—Si—O—Si). Silica sol is a dispersion of ultrafine silica particles having a particle size of 1 nm to 100 nm in water or a polar solvent, and also called colloidal silica. Specifically, it is described in "Application Techniques of High Purity Silica" supervised by Tosiro Kagami and Ei Hayashi, vol. 3, CMC Corporation (1991).

Further, alumina sol is an alumina hydrate (boehmite based) having a colloid size of 5 nm to 200 nm, and one in which alumina particles are dispersed using an anion in water (for example, a halogen atom ion such as a fluorine ion or a chlorine ion, or a carboxylic acid anion such as an acetic acid ion as a stabilizer.

The above-mentioned hydrophilic sol particles have preferably an average size of 10 nm to 50 nm, and more preferably an average size of 10 nm to 40 nm. All of these hydrophilic sol particles are easily available as commercial products.

When the particle size of each the hydrophilic particles used in the present invention and the hydrophilic sol particles which may be used in combination therewith (all taken together, they are also merely referred to as silica particles) is within the above-mentioned range, the effects are exhibited that the film strength of the image recording layers is sufficiently maintained, and that plate-making by exposure due to laser beams and printing as the printing plates provide ones causing no adhered stains of printing ink onto non-image areas and extremely excellent in hydrophilicity.

The existing ratio of the silica particles which may be used in combination with the hydrophilic particles used in the present invention is from 100:0 to 30:70 by weight, and preferably from 100:40 to 0:60 by weight.

Further, when the hydrophilic particles and the hydrophilic sol particles are added to the image recording layers, the total amount thereof added is from 2% to 50% by weight, and preferably from 5% to 40% by weight, based on solid of image recording layer.

In the image recording layers of the present invention, the use of the above-mentioned inorganic pigment particles and the above-mentioned hydroxyl group-containing organic polymers in combination preferably maintains the film strength while keeping the hydrophilicity. When they are used in combination, the ratio thereof used is from 85:15 to 50:50 by weight, and preferably from 15:85 to 40:60 by weight.

<Dyes and Pigments>

For distinguishing the kind of plate by coloring, dyes or pigments can be added to the image recording layers of the present invention.

Preferred examples of the dyes include Rhodamine 6G chloride, Rhodamine B chloride, Crystal Violet, Malachite Green oxalate, oxazine 4-perchlorate, quinizarin, 2-(α-naphthyl)-5-phenyloxazole and coumarin-4. Other specific examples of the dyes include triphenylmethane, diphenylmethane, oxazine, xanthene, iminonaphthoquinone, azomethine and anthraquinone dyes represented by Oil Yellow #101, Oil Yellow #103, Oil Pink #312, Oil Green BG, Oil Blue BOS, Oil Blue #603, Oil Black BY, Oil Black BS, Oil Black T-505 (the above are manufactured by Orient Kagaku Kogyo Co. Ltd.), Victoria Pure Blue, Crystal Violet (CI 42555), Methyl Violet (CI 42535), Ethyl Violet, lethylene Blue (CI 52015), Patent Pure Blue (manufactured by Sumitomo Mikuni Kagaku Co. Ltd.), Brilliant Blue, Methyl Green, Erythrlcin B, Basic Fuchsine, m-Cresol Purple, Auramine, 4-p-diethylaminophenylimino-naphthoquinone and cyano-p-diethylaminophenylacetanilide, or dyes described in JP-A-62-293257 (the term "JP-A" as used herein means an "unexamined published Japanese patent application") and JP-A-9–179290.

When added to the image recording layers, the above-mentioned dyes are contained usually in an amount of about 0.02% to about 10% by weight, and more preferably in an amount of about 0.1% to about 5% by weight, based on the total solid content of image recording layer.

<Surfactants>

For widening the stability to printing conditions, nonionic surfactants as described in JP-A-62-251740 and JP-A-3-208514 and amphoteric surfactants as described in JP-A-59-121044 and JP-A-4-13149 can be added to the image recording layers of the lithographic printing plate precursors of the present invention.

Specific examples of the nonionic surfactants include sorbitan tristearate, sorbitan monopalmitate, sorbitan trioleate, stearic acid monoglyceride and polyoxyethylene nonyl phenyl ether.

Specific examples of the amphoteric surfactants include alkyldi(aminoethyl)glycines, alkylpolyaminoethylglycine hydrochlorides, 2-alkyl-N-carboxyethyl-N-hydroxyethyl-imidazoliniumbetaine, N-tetradecyl-N,N-betaine type surfactants (for example, Amorgen K (trade name) manufactured by Dai-ichi Kogyo Seiyaku Co., Ltd.).

The above-mentioned nonionic and amphoteric surfactants account for preferably 0.05% to 15% by weight, more preferably 0.1% to 5% by weight, based on the total solid content of image recording layer.

In some cases, fluorine surfactants can be further used in the image recording layers within the above-mentioned range of the amount of the surfactants added. Specifically, perfluoroalkyl group-containing surfactants are preferred, and examples thereof include anionic surfactants having any of carboxylic acids, sulfonic acids, sulfates and phosphates, cationic surfactants such as aliphatic amines and quaternary ammonium salts, betaine type amphoteric surfactants and nonionic surfactants such as fatty acid esters of polyoxy compounds, polyalkylene oxide condensing type surfactants and polyethyleneimine condensing type surfactants.

<Plasticizers>

Further, for imparting flexibility to coating films, plasticizers are added to the image recording layers of the lithographic printing plate precursors of the present invention, as needed. For example, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid are used.

<Solvents>

In coating solutions for image recording layers, aqueous solvents are used. Further, for homogenizing the solutions by inhibition of precipitation in preparing the coating solutions, water-soluble solvents are used in combination therewith. Examples of the water-soluble solvents include alcohols (methanol, ethanol, propyl alcohol, ethylene glycol, diethylene glycol, propylene glycol, dipropylene glycol, ethylene glycol monomethyl ether, propylene glycol monomethyl ether and ethylene glycol monoethyl ether, ethers (tetrahydrofuran, ethylene glycol dimethyl ether, propylene glycol dimethyl ether and tetrahydropyrene), ketones (acetone, methyl ethyl ketone and acetylacetone), esters (methyl acetate and ethylene glycol monomethyl acetate) and amides (formamide, N-methylformamide, pyrrolidone and N-methylpyrrolidone). They may be used either alone or as a combination of two or more of them.

These solvents may be used either alone or as a mixture thereof. When the coating solution is prepared, the concentration of the ingredients constituting the above-mentioned image recording layer (the total content of solid ingredients including additives) is preferably 1% to 50% by weight.

Coating

Ingredients selected from the above-mentioned respective constituent ingredients are mixed, and the coating solution thus prepared is applied onto a support by using any one of the conventional known methods, followed by drying to form a film.

As the coating methods, various known methods can be used. Examples thereof include bar coater coating, rotation coating, spray coating, curtain coating, dip coating, air knife coating, blade coating and roll coating.

For improving the coating properties, surfactants, for example, fluorine surfactants as described in JP-A-62-170950, can be added to the image recording layers of the lithographic printing plate precursors of the present invention. The amount thereof added is preferably from 0.01% to 1% by weight, and more preferably from 0.05% to 0.5% by weight, based on the total solid content of image recording layer.

The amount coated (solid content) of the image recording layers obtained after coating and drying is preferably from 0.1 $g/m^2$ to 30 $g/m/m^2$, and more preferably from 0.3 $g/m^2$to 10 $g/m^2$, for ordinary lithographic printing plate precursors, although it varies depending on their use.

The thickness of the coating films is from 0.03 $\mu$m to 10 $\mu$m, preferably from 0.1 $\mu$m to 3 $\mu$m, and more preferably from 0.3 $\mu$m to 1 $\mu$m.

The surfaces of the lithographic printing plate precursors of the present invention are hydrophilic, so that they are liable to be hydrophobilized by the influence of environmental circumstances during handling before use, influenced by temperature and humidity, or influenced by mechanical flaws or stains. Usually, printing plate surface is coated with burning conditioners (also called gum solutions) to protect surfaces thereof in the plate-making stage. However, when the protective solutions are applied in preparing the printing plate precursors, there are advantages that such protection can be obtained from immediately after the production, and that the trouble of newly applying the burning conditioners in the plate-making stage can be saved to improve the workability. This effect is profound particularly in the printing plate precursors of the present invention having the hydrophilic surfaces.

Accordingly, as a preferred embodiment of the present invention, the surface protective layers are provided on the image recording layers, as described above. The composition of the surface protective layers is the same as that of the burning conditioners (gum solutions), details of which are described later as "burning conditioners".

Substrates

Substrates to be coated with the image recording layers are described below.

As the substrates, dimensionally stable plate-like materials are used. Examples of the substrates which can be used in the present invention include paper, paper laminated with plastics (for example, polyethylene, polypropylene and polystyrene), metal plates (for example, aluminum, zinc, copper, nickel and stainless steel plates), plastic films (for example, cellulose diacetate, cellulose triacetate, cellulose propionate, cellulose butyrate, cellulose acetate butylate, cellulose nitrate, polyethylene terephthalate, polyethylene, polystyrene, polypropylene, polycarbonates and polyvinyl acetal) and paper or plastic films laminated or vapor deposited with the above-mentioned metals.

The substrates are preferably polyester films, aluminum plates or SUS plates which are difficult to corrode on the printing plates. Of these, the aluminum plates which are good in dimensional stability and relatively inexpensive are preferred.

Preferred examples of the aluminum plates include a pure aluminum plate and alloy plates mainly composed of aluminum and containing foreign elements in slight amounts. Further, plastic films laminated or vapor deposited with aluminum may be used. Examples of the foreign elements contained in the aluminum alloys include silicon, iron, manganese, copper, magnesium, chromium, zinc, bismuth, nickel and titanium. The content of the foreign elements in the alloys is at most 10% by weight or less. Although aluminum particularly suitable in the present invention is pure aluminum, it is difficult in respect to refining technology to produce completely pure aluminum. Accordingly, aluminum may slightly contain foreign elements. Like this, the aluminum plates applied to the present invention are not specified in their composition, and the aluminum plates of conventional raw materials well known in the art can be appropriately utilized. The thickness of the substrates used in the present invention is from about 0.05 mm to about 0.6 mm, preferably from 0.1 mm t 0.4 mm, and particularly preferably from 0.15 mm to 0.3 mm.

Prior to surface roughening of the aluminum plates, degreasing treatment for removing rolling oil on surfaces thereof is conducted, for example, with surfactants, organic solvents or alkaline aqueous solutions if desired.

The surface roughening treatment of the aluminum plates is carried out by various methods, for example, methods of mechanically roughening the surfaces, methods of electrochemically roughening the surfaces by dissolution and methods of chemically selectively dissolving the surfaces. As the mechanical methods, known methods such as ball polishing, brushing, blasting and buffing can be used. As the chemical methods, methods of immersing the plates in saturated aqueous solutions of aluminum salts of mineral acids as described in JP-A-54-31187 are suitable. Further, the electrochemical surface roughening methods include methods of roughening the surfaces in electrolytic solutions containing hydrochloric acid or nitric acid with alternating current or direct current. Furthermore, electrolytic surface roughening methods of using mixed acids as described in JP-A-54-63902 can also be utilized.

Of such surface roughening methods, surface roughening methods in which mechanical surface roughening and electrochemical surface roughening are combined as described in JP-A-55-137993 are preferred, because of strong adhesion of ink-receptive images to the substrates.

The surface roughening by the methods as described above is preferably conducted within such a range that the center line surface roughness (Ra) of the surfaces of the aluminum plates becomes 0–3 $\mu$m to 1.0 $\mu$m.

The aluminum plates thus roughened are subjected to alkali etching treatment using aqueous solutions of potassium hydroxide and sodium hydroxide as needed, and further to neutralizing treatment, followed by anodic oxidization for enhancing the water receptivity and the wear resistance of the surfaces, as desired.

As electrolytes used in anodic oxidization of the aluminum plates, various electrolytes forming porous oxide films can be used. In general, sulfuric acid, hydrochloric acid, oxallc acid, chromic acid and mixed acids thereof are used. The concentration of the electrolyte can be appropriately determined depending on the kind of electrolyte.

The conditions of anodic oxidation can not be specified without reservation, because they vary depending on the kind of electrolyte. However, an electrolyte concentration within the range of 1% to 80% by weight, a solution temperature within the range of 5° C. to 70° C., a current density within the range of 5 $A/dm^2$ to 60 $A/dm^2$, a voltage within the range of 1 V to 100 V and an electrolytic time within the range of 10 seconds to 5 minutes are generally proper.

The amount of anodic oxide films formed is preferably from 1.0 $g/m^2$ to 5.0 $g/m^2$, and particularly from 1.5 $g/m^2$ to 4.0 $g/m^2$. Less than 1 $g/m^2$ results in insufficient press life or easy development of scratches in non-image areas of the lithographic printing plates, which causes a tendency to form so-called "scratching stains" due to adhesion of ink to the scratches in printing.

Of these anodic oxidation treatment methods, anodic oxidation methods at a high current density in sulfuric acid described in British Patent 1,412,768 and anodic oxidation methods using phosphoric acid as an electrolytic bath described in U.S. Pat. No. 3,511,661 are preferred.

The above-mentioned aluminum plates preferably subjected to the surface roughening and further the anodic oxidation may be subjected to hydrophilization treatment, if necessary. Preferred examples thereof include methods of treating the plates with alkali metal silicates, for example, an aqueous solution of sodium silicate, as described in U.S. Pat. Nos. 2,714,066 and 3,181,461, with potassium fluorozirconate disclosed in JP-B-36-22063, or with polyvinylphosphonic acid as disclosed in U.S. Pat. No. 4,153,461. Background stain can be prevented by the hydrophilization treatment in many cases.

The aluminum plates and SUS plates may be provided with organic undercoat layers prior to coating of light-sensitive layers as needed. Organic compounds used in the organic undercoat layers include, for example, carboxymethyl cellulose, dextrin, gum arabic, amino group-containing phosphonic acids such as 2-aminoethylphosphonic acid, organic phosphonic acids such as phenylphosphonic acid, naphthyl-phosphonic acid, alkylphosphonic acids, glycerophosphonic acid, methylenediphosphonic acid and ethylenediphosphonic acid, which may have substituent groups, organic phosphoric acids such as phenylphosphoric acid, naphthylphosphoric acid, alkylphosphoric acids and glycerophosphoric acid, which may have substituent groups, organic phosphinic acids such as phenylphosphinic acid, naphthylphosphinic acid, alkyl-phosphinic acids and glycerophosphinic acid, which may have substituent groups, amino acids such as glycine and β-alanine, and hydroxyl group-containing amine hydrochlorides, such as triethanolamine hydrochlorides. They may be used as a mixture of two or more of them.

The undercoat layers can be provided by the following methods. That is to say, there are methods of dissolving the above-mentioned organic compounds in water, organic solvents such as methanol, ethanol and methyl ethyl ketone, or mixed solvents thereof, and applying the resulting solutions onto the aluminum plates, followed by drying, and methods of dissolving the above-mentioned organic compounds in water, organic solvents such as methanol, ethanol and methyl ethyl ketone, or mixed solvents thereof, and immersing the aluminum plates in the resulting solutions to allow the above-mentioned organic compounds to be adsorbed thereby, followed by washing with water and drying to provide the undercoat layers. According to the former methods, the solutions of the above-mentioned organic compounds having a concentration of 0. 005% to 10% by weight can be applied by various methods. For example, any of bar coater coating, rotation coating, spray coating and curtain coating may be used. On the other hand, according to the latter methods, the concentration of the solutions is from0. 01% to 20% by weight, and preferably from 0.05% to 5% by weight, the immersing temperature is from 20° C. to 90° C., and preferably from 25° C. to 50° C., and the immersing time is from 0.1 second to 20 minutes, and preferably from 2 seconds to 1 minute.

The pH of the solutions used herein can be adjusted with basic materials such as ammonium, triethylamine and potassium hydroxide, or acid materials such as hydrochloric acid and phosphoric acid to use them within the range of pH 1 to pH 12. For improving the tone reproduction of the photosensitive lithographic printing plates, yellow dyes can also be added.

The amount of the organic undercoat layers coated after drying is suitably from 2 mg/$m^2$to 200 mg/$m^2{}_7$ and preferably from 5 mg/$m^2$ to 100 mg/$m^2$. If the above-mentioned amount coated is less than 2 mg/$m^2$, the sufficient press life is not obtained. Exceeding 200 mg/$m^2$ also yields similar results.

On the other hand, when the image recording is carried out by removal (abrasion) caused by laser beam irradiation, the hydrophilic image layers are scattered to expose the substrates, thereby converting light-irradiated regions from hydrophilic to hydrophobic. It is therefore necessary that the surfaces of the substrates are hydrophobic. Accordingly, when the substrates are made of aluminum, it is preferred that the surfaces of the substrates are subjected to hydrophobilization treatment after the substrate adhesion has been secured by the surface roughening and the anodic oxidation according to the above-mentioned methods. The hydrophobilization treatment is conducted by applying undercoat solutions containing, for example, silane coupling agents or titanium coupling agents in some cases. The silane coupling agents are mainly represented by formula $(RO)_3SiR'$ (R and R' each represents an alkyl group or the like). RO groups are hydrolyzed to yield OH groups, which are bonded to the surface of the substrate by ether linkages, whereas R' groups provide the hydrophobic surface receiving ink.

The silane coupling agents include γ-chloropropyltrimethoxysilane, vinyltrichlorosilane, vinyltriethoxysilane, vinyltris(β-methoxy-ethoxy)silane, γ-methacryloxypropyltrimethoxysilane, γ-glycosidoxypropyltrimethoxysilane, γ-mercaptopropyltrimethoxysilane, γ-aminopropyltriethoxysilane, γ-ureidopropyl-triethoxysilane and N-(β-aminoethyl)-(β-aminopropyl)di-methoxysilane.

As another means for hydrophobilizing the surfaces exposed by removal caused by laser beam irradiation, the organic polymers described as other additives to the image recording layers may be applied as intermediate layers.

The SUS or plastic plates are originally hydrophobic, and removal caused by laser beam irradiation results in exposure of the surfaces, which causes the surfaces to receive ink. For securing the adhesion to the image recording layers, the plastic plates are subjected to antistatic treatment by known methods prior to coating.

Other Layers

Backcoats are formed on the back sides of the supports as so required. Coating layers comprising organic polymers described in JP-A-5-45885 and metal oxides obtained by hydrolysis and polycondensation of organic or inorganic metal compounds described in JP-A-6-35174 are preferably used as such backcoats.

Of these coating layers, alkoxy compounds of silicon such as $Si(OCH_3)_4$, $Si(OC_2H_5)_4$, $Si(OC_3H_7)_4$ and $Si(OC_4H_9)_4$ are particularly preferred, because they are inexpensive and easily available, and the coating layers of metal oxides obtained therefrom are excellent in hydrophilicity.

Plate-making Methods

Then, methods for making the lithographic printing plate precursors are described below. To the lithographic printing plate precursors, for example, thermosensitive recording is directly applied imagewise by thermal recording heads, or solid lasers or semiconductor lasers irradiating infrared rays having a wavelength of 760 nm to 1200 nm, high illuminance flush light such as xenon discharge lamp light or light-heat conversion type exposure such as infrared ray lamp exposure can also be used.

The image writing system may be either the face exposure system or the scanning system. The former case is the infrared ray irradiation system or the system of irradiating high illuminance short-time light of xenon lamps onto the printing plate precursors to generate heat by light-heat conversion. When face exposure-light sources such as infrared lamps are used, the preferred exposure amount varies depending on their illuminance. However, usually, the face exposure intensity before modulation with images for printing is preferably within the range of 0.1 J/$cm^2$ to 10 J/$cm^2$, and more preferably within the range of 0.1 J/$cm^2$ to 1 J/$cm^2$. When the supports are transparent, exposure can also be performed through the supports from the back sides thereof. The exposure illuminance is preferably selected so that the above-mentioned exposure intensity is obtained by irradiation for a exposure time of 0.01 msec to 1 msec, preferably 0.01 msec to 0.1 msec. When the irradiation time is long, it becomes necessary to increase the exposure intensity, from the competition relationship between the rate of formation of heat energy and the rate of diffusion of heat energy formed.

In the latter case, the system of using laser light sources containing infrared ray components in large quantities, and modulating images with laser beams to scan on the printing plate precursors is carried out. Examples of the laser light sources include semiconductor lasers, helium-neon lasers, helium-cadmium lasers and YAG lasers. Irradiation can be conducted with lasers having a laser output of 0–1 W to 300 W. Further, when pulse lasers are used, irradiation is preferably conducted with lasers having a peak output of 1000 W, preferably 2000 W. With respect to the exposure amount in this case, the face exposure intensity before modulation with images for printing is preferably within the range of 0. 1 J/$cm^2$ to 10 J/$cm^2$, and more preferably within the range of 0.3 J/$cm^2$ to 1 J/$cm^2$. When the supports are transparent, exposure can also be performed through the supports from the back sides thereof.

In making the lithographic printing plates, water development is carried out after image exposure, and burning conditioners containing printing plate surface protective agents (so-called gum solutions) are further applied for protecting non-image areas, if necessary. This process is called "gumming". The gumming is carried out on various purposes to prevent the hydrophilic surfaces of the lithographic printing plates from being lowered by the influence of slight amounts of contaminants in the air, to enhance the hydrophilicity of non-image areas, to prevent the lithographic printing plates from deteriorating for the period from after plate-making to printing, or from interruption of printing to restarting thereof, to prevent non-image areas from becoming ink-receptive to get stained by adhesion of ink which is smeared on the fingers when the lithographic printing plates are handled in mounting them on the printing machines, and further to prevent non-image areas and image areas from being damaged when the lithographic printing plates are handled.

Preferred specific examples of water-soluble resins having film forming properties used for these purposes include gum arabic, cellulose derivatives (for example, carboxymethyl cellulose, carboxyethyl cellulose and methyl cellulose) and modified products thereof, polyvinyl alcohol and derivatives thereof, polyvinylpyrrolidone, polyacrylamide and copolymers thereof, acrylic acid copolymers, vinyl methyl ether/maleic anhydride copolymers, vinyl acetate/maleic anhydride copolymers, styrene/maleic anhydride copolymers, roasted dextrin, oxygen-decomposed dextrin and enzymolyzed etherified dextrin.

The content of the above-mentioned water-soluble resins in the protective agents contained in the burning conditioners is properly from 3% to 25% by weight, and preferably from 10% to 25% by weight.

In the present invention, the above-mentioned water-soluble resins may be used as a mixture of two or more of them.

In addition, various surfactants may be added to the printing plate surface protective agents for the lithographic printing plates. The surfactants which can be used include anionic surfactants and nonionic surfactants. The anionic surfactants include aliphatic alcohol sulfates, tartaric acid, malic acid, lactic acid, lepulic acid and organic sulfonic acids. As mineral acids, nitric acid, sulfuric acid and phosphoric acid are useful. Mineral acids, organic acids and inorganic acids may be used either alone or as a combination of two or more of them.

In addition to the above-mentioned ingredients, lower polyhydric alcohols such as glycerin, ethylene glycol and triethylene glycol can also be used as wetting agents. The amount of these wetting agents used is properly from 0.1% to 5.0% by weight, and preferably from 0.5% to 3.0% by weight, based on the protective agent. In addition to the above, preservatives can be added to the printing plate surface protective agents for the lithographic printing plates of the present invention. For example, benzoic acid and derivatives thereof, phenol, formalin or sodium dehydroacetate can be added in an amount ranging from 0.005% to 2.0% by weight.

Anti-foaming agents can also be added to the printing plate surface protective agents. Preferred examples of the anti-foaming agents include organic silicone compounds, and the amount thereof added is preferably from 0.0001% to 0.1% by weight.

Organic solvents can be added to the printing plate surface protective agents, for preventing the ink-receptivity of image areas from being deteriorated. Preferred examples of the organic solvents are solvents sparingly soluble in water, which include petroleum fractions having a boiling point of about 120° C. to about 250° C., for example, plasticizers having a solidifying point of 15° C. or less and a boiling point of 300° C. or more such as dibutyl phthalate and dioctyl adipate. Such organic solvents are added in an amount ranging from 0.05% to 5% by weight.

The printing plate surface protective agents can take any one of the uniform solution, suspension and emulsion forms, and particularly, the emulsion form containing the organic solvents as described above exhibits excellent performance. In this case, surfactants are preferably added in combination therewith, as described in JP-A-55-105581.

The printing plate precursors image exposed, water developed after exposure and further subjected to gumming if necessary can also be mounted on printing machines to conduct printing. Further, immediately after exposure (without the use of the development process), the printing plate precursors can also be mounted on printing machines to conduct printing. In this case, heated areas or exposed areas are swelled with fountain solutions to remove swelled areas, thereby forming the lithographic printing plates. That is to say, according to the plate-making methods using the lithographic printing plate precursors of the present invention, the lithographic printing plates can be made without the use of development processing. The term "water development" used in the present invention means development with water or developing solutions mainly composed of water and having a pH of 2 or more.

EXAMPLE

The present invention will be further illustrated in greater detail with reference to the following examples, which are, however, not to be construed as limiting the invention.

Examples 1 to 7 and Comparative Examples 1 and 2

(1) Preparation of Substrate

A surface of a 0.24-mm thick rolled plate made of a JIS A1050 aluminum material comprising 99.5% by weight of aluminum, 0.01% by weight of copper, 0.03% by weight of titanium, 0.3% by weight of iron and 0.1% by weight of silicon was grained by the use of a 20-wt % aqueous suspension of 400-mesh pumice (manufactured by Kyoritsu Ceramic Materials Co. Ltd.) and a rotary nylon brush (6,10-nylon), followed by sufficient washing with water.

The resulting plate was immersed in a 15 wt % aqueous solution of sodium hydroxide (containing 4.5% by weight of aluminum) to etch it so that aluminum is dissolved in an amount of 5 g/m$^2$, followed by washing with running water. After further neutralization with 1 wt % $HNO_3$, the plate was subjected to electrolytic surface-roughening treatment in a 0.7 wt % aqueous solution of nitric acid by the use of rectangular alternating waveform voltage having an anode voltage of 10.5 V and a cathode voltage of 9.3 V (current ratio r=0.90, the waveform described in JP-B-58-5796) at an anode quality of electricity of 160 coulombs/dm$^2$. After washing, the plate was immersed in a 10 wt % aqueous solution of sodium hydroxide at 35° C. to etch it so that aluminum is dissolved in an amount of 1 g/m$^2$, followed by washing. Subsequently, the plate was immersed in a 30 wt % aqueous solution of sulfuric acid at 50° C. and desmutted, followed by washing with water.

Further, the plate was subjected to porous anodic oxidized film formation treatment in a 20 wt % aqueous solution of sulfuric acid (containing 0.8% by weight of aluminum) using direct current. That is to say, electrolysis was carried out at a current density of 13 A/dm$^2$ to obtain an anodic oxidized film weight of 2.7 g/m$^2$ by adjusting the electrolytic time.

After washing with water, this plate was immersed in a 3 wt % aqueous solution of sodium silicate at 70° C. for 30 seconds, followed by washing with water and drying.

The aluminum substrate obtained as described above has a reflection density of 0.30, measured with a Macbeth RD920 reflection densitometer, and a center line average roughness of 0.58 $\mu$m.

(2) Coating of Image Recording Layers

<Preparation of Tetramethoxysilane Dispersion>

A dispersion of the following formulation (A) containing tetramethoxysilane as a sol-gel convertible ingredient (referred to as sol-gel solution (A)) was prepared. With regard to the preparation method, silicon tetraethoxide, ethanol, pure water and nitric acid were mixed in this order, and stirred at room temperature for 1 hour to prepare sol-gel solution (A). Formulation of Sol-Gel Solution (A)

| | |
|---|---|
| Silicon Tetraethoxide | 18.37 g |
| Ethanol (95%) | 32.56 g |
| Pure Water | 32.56 g |
| Nitric Acid | 0.02 g |

<Preparation of Coating Solutions for Image Recording Layers>

Ten kinds of dispersions in total comprising the above-mentioned sol-gel solution (A), and fine light-heat convertible particles of Examples 1 to 8 and fine particles of Comparative Examples 1 and 2 shown in Table 1 were prepared as coating solutions for image recording layers. To each mixture containing respective ingredients as shown in the following formulation, 10 g of glass beads were added, and stirred in a paint shaker for 10 minutes to prepare each dispersion.

Formulation of Coating Solutions for Image Recording Layers

| | |
|---|---|
| Fine Light-Heat Convertible Particles (Table 1) | 2.17 g |
| Sol-Gel Solution (A) | 3.34 g |
| Polyvinyl Alcohol [PVA 117, manufactured by Kuraray Co., Ltd.] (10% aqueous solution) | 3.50 g |
| Colloidal Silica [Snowtex C, manufactured by Nissan Chemical Industries, Ltd.] (20% aqueous solution) | 6.0 g |
| Pure Water | 7.49 g |

The silicate treatment of the fine light-heat convertible particles of Examples 2, 4 and 7 shown in Table 1 was conducted by immersing the particles in a 30% aqueous solution of sodium silicate at 70° C. for 30 seconds. The carbon black dispersion of Example 5 was obtained by deaerating carbon black particles (10 g) under a reduced pressure of 0.01 Torr, thereafter allowing water vapor to flow under irradiation of plasma having an output of 20 W to introduce hydroxyl groups onto surfaces of the particles, dispersing the resulting particles in water, and adding dropwise thereto 20 ml of tetraethoxysilane, followed by stirring for 2 hours.

The carbon black particles of the carbon black dispersion of Comparative Example 1 were ones not subjected to surface treatment. The silica dispersion of Comparative Example 2 was given as an example of poor light-heat convertibility.

<Coating>

Each coating solution obtained above was applied onto the above-mentioned aluminum substrate by bar coating using a #14 bar so as to give a dry thickness of 2.0 μm. Then, the substrate thus coated was placed in an air oven and dried at 100° C. for 10 minutes to form an image recording layer.

(3) Preparation of Printing Plates

<Preparation of Printing Plates and Printing>

The resulting lithographic printing plate precursor 1 to 8 were irradiated with a semiconductor laser beam having a wavelength of 830 nm.

Specific laser irradiation conditions are shown below:

Laser output: 350 mW

Beam radius: 12.5 μm

Scanning speed: 1.7 m/second

Output: 700 mJ/$cm^2$

The laser-exposed printing plate precursors were mounted on a printing machine without after treatment to conduct printing. When 10,000 sheets and 20,000 sheets were printed, the degree of print stains was visually examined.

The printing machine used was a Heidelberg SOR-M machine, and an aqueous solution of 1% by volume of EU-3 (manufactured by Fuji Photo Film Co., Ltd.) and 10% by volume of IPA in water was used as a fountain solution. As ink, GEOS (N) Chinese ink was used.

(4) Evaluation of Printing Plate Precursors

Evaluation of the printing plate precursors completed was made as follows.

<Evaluation Method of Print Stains>

When 10,000 sheets were printed, the degree of print stains on a surface of the printed paper was visually examined. The case that no print stains were observed is indicated by ○, and the case that print stains were observed is indicated by x. Further, the case that extremely slight print stains (a 0.01 increase in density measured by a reflection densitometer in accordance with ISO 5-4) were observed is indicated by Δ. For the printing plate precursors which showed no print stains, further 10,000 sheets were printed, and the case that no print stains were observed yet on a surface of the printed paper is indicated by ◎. The results are shown in Table 1 below.

<Degree of Surface Hydrophilicity>

The measured values of the coefficient of hydrophilicity showing the degree of hydrophilicity of the fine particles are shown together as reference data in Table 1, although not directly indicating the performance of the printing plates.

TABLE 1

| Sample | Light-Heat Convertible Particles | Particle Diameter (μm) | Coefficient of Hyrophilicity (%) | Print Stains |
|---|---|---|---|---|
| Example 1 | Fine iron oxide ($Fe_3O_4$) particles | 0.2 | 30 | Δ |
| Example 2 | Fine iron oxide ($Fe_3O_4$) particles subjected to silicate treatment | 0.2 | 90 | ◎ |
| Example 3 | Fine particles of metallic iron coated with alumina | 0.1 | 70 | ○ |
| Example 4 | Fine particles of alumina-coated metallic iron subjected to silicate treatment | 0.1 | 90 | ◎ |
| Example 5 | Fine particles of carbon black coated with silica | 0.02 | 80 | ○ |
| Example 6 | Fine Titan Black ($TiO_x$) particles | 0.1 | 50 | ○ |
| Example 7 | Fine particles of Titan Black ($TiO_x$) subjected to silicate treatment | 0.1 | 80 | ◎ |
| Comparative Example 1 | Carbon black dispersion | 0.02 | 5 | x |
| Comparative Example 2 | Dispersion of fine silica particles | 0.1 | 90 | x |

Note 1.
$TiO_x$ (x = 1.0–1.1) is commercially available Titan Black.

(5) Results

As shown in Table 1, Examples 1 to 8 of the present invention all showed no print stains even when 10,000 sheets or more were printed (in Example 1, the limit is 10,000 sheets) and excellent press life. Further, as is apparent from the respective comparisons of Example 1 with Example 2, Example 3 with Example 4, and Example 6 with Example 7, when surfaces of the particles were subjected to silicate treatment to enhance the degree of hydrophilicity, no print stains were observed even when 20,000 sheets were printed, and more excellent press life was exhibited. Except for the example of carbon black (Example 5), the coefficient of hydrophilicity well corresponded to decreased print stains, and it was also shown that the hydrophilicity of the surfaces of the fine light-heat convertible particles improved the press life. Further, Example 5 and Comparative Example 1 reveals that even hydrophobic particles such as carbon black particles are significantly improved in press life by hydrophilizing the surfaces thereof. In Comparative Example 2, no image was formed. As a result, printing was impossible (this was evaluated as x, but not caused by print stains). This indicates that the press life is low and the effect of the present invention does not appear, when the particle surfaces are not light-heat convertible, although they are hydrophilic.

The lithographic printing plate precursors of the present invention in which the image recording layers containing fine light-heat convertible particles hydrophilic in their surfaces and converted to hydrophobic by the action of heat are provided on the substrates have the excellent printing properties that the discrimination between the image regions and the non-image regions is high, that the press life is excellent, and that print stains are difficult to be developed. Further, according to the present invention, the lithographic printing plate precursors can be provided which can be directly made from digital data by recording, particularly using solid lasers or semiconductor lasers irradiating infrared rays.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor comprising a substrate having provided thereon an image recording layer containing fine light-heat convertible particles which are coated with a hydrophilic material, the layer being made hydrophobic by the action of heat.

2. The lithographic printing plate precursor as claimed in claim 1, which comprises the substrate having provided thereon an image recording layer containing the fine light-heat convertible particles which are coated with a hydrophilic material, the particles being contained in the image recording layer by being dispersed in a hydrophilic medium.

3. The lithographic printing plate precursor as in claim 2, wherein the hydrophilic medium is a sol-gel conversion system comprising polymer in which binding groups extending from multivalent elements form network structures through oxygen atoms and multivalent metals have unbonded hydroxyl groups or alkoxyl groups at the same time to form resinous structures containing mixtures thereof.

4. The lithographic printing plate precursor as in claim 1, wherein a water-soluble protective layer is formed on a surface of the printing plate precursor.

5. A lithographic printing plate precursor comprising a hydrophobic substrate or a substrate provided with a hydrophobic layer, the substrate having provided thereon an image recording layer comprising a hydrophilic medium comprising fine light-heat convertible particles which are coated with a hydrophilic material, and image recording is conducted by removing the hydrophilic medium by laser beam irradiation.

* * * * *